(12) United States Patent
Yang et al.

(10) Patent No.: US 11,528,094 B2
(45) Date of Patent: Dec. 13, 2022

(54) DATA SENDING AND RECEIVING METHOD AND DEVICE

(71) Applicant: HUAWEI TECHNOLOGIES CO., LTD., Guangdong (CN)

(72) Inventors: Wenbin Yang, Beijing (CN); Tongtong Wang, Beijing (CN); Xinyuan Wang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/829,355

(22) Filed: May 31, 2022

(65) Prior Publication Data

US 2022/0294562 A1 Sep. 15, 2022

Related U.S. Application Data

(63) Continuation of application No. 17/511,303, filed on Oct. 26, 2021, which is a continuation of application
(Continued)

(30) Foreign Application Priority Data

Dec. 17, 2013 (CN) ................ PCT/CN2013/089697
Dec. 28, 2013 (CN) ................ PCT/CN2013/090803

(51) Int. Cl.
  *H04L 1/00* (2006.01)
  *H03M 13/27* (2006.01)
  *H03M 13/29* (2006.01)

(52) U.S. Cl.
  CPC ...... *H04L 1/0071* (2013.01); *H03M 13/2792* (2013.01); *H03M 13/2906* (2013.01); *H04L 1/0057* (2013.01)

(58) Field of Classification Search
  CPC ................ H04L 1/0071; H04L 1/0057; H03M 13/2792; H03M 13/2906
  See application file for complete search history.

(56) References Cited

U.S. PATENT DOCUMENTS 6,055,242 A   4/2000  Doshi et al.
6,128,330 A   10/2000 Schilling
(Continued)

FOREIGN PATENT DOCUMENTS

CN   1272733 A   11/2000
CN   1417967 A   5/2003
(Continued)

OTHER PUBLICATIONS

IEEE P802.3batmD3.2, Part 3: Carrier Sense Multiple Access with Collision Detection (CSMA/CD) Access Method and Physical Layer Specifications Amendment: Media Access Control Parameters, Physical Layers and Management Parameters for 40 Gb/s and 100 Gb/s Operation. Mar. 24, 2010, 461 pages.
(Continued)

*Primary Examiner* — Kyle Vallecillo
(74) *Attorney, Agent, or Firm* — Huawei Technologies Co., Ltd.

(57) ABSTRACT

An embodiment of the present disclosure contemplates a data sending and receiving method and apparatus. A first FEC unit of a sending device sends, by using a first channel, a first data stream on which first FEC encoding has been performed; a second FEC unit of the sending device sends, by using a second channel, a second data stream on which second FEC encoding has been performed; and the sending device performs interleaving on the first data stream and the second data stream, to obtain an output data stream, and sends the output data stream to a receiving device and error correction capability of a receiving device could be improved. In addition, in the present disclosure, an operation
(Continued)

of writing by row and reading by column does not need to be performed. Therefore, no delay is generated.

30 Claims, 14 Drawing Sheets

Related U.S. Application Data

No. 17/003,938, filed on Aug. 26, 2020, now Pat. No. 11,356,203, which is a continuation of application No. 16/374,414, filed on Apr. 3, 2019, now Pat. No. 10,797,828, which is a continuation of application No. 15/186,040, filed on Jun. 17, 2016, now Pat. No. 10,291,358, which is a continuation of application No. PCT/CN2014/094081, filed on Dec. 17, 2014.

(56) References Cited

U.S. PATENT DOCUMENTS

| | | | |
|---|---|---|---|
| 8,089,993 | B2 | 1/2012 | Wei et al. |
| 8,775,892 | B2 | 7/2014 | Zhang et al. |
| 9,397,786 | B2 * | 7/2016 | Zhang .................. H04L 1/0063 |
| 2004/0258167 | A1 | 12/2004 | Powell |
| 2005/0220211 | A1 | 10/2005 | Shim et al. |
| 2007/0014331 | A1 | 1/2007 | Eldon et al. |
| 2009/0169204 | A1 | 7/2009 | Meagher et al. |
| 2010/0220768 | A1 | 9/2010 | Zeng et al. |
| 2010/0287449 | A1 | 11/2010 | Kubo et al. |
| 2011/0103516 | A1 | 5/2011 | Bao et al. |
| 2013/0216221 | A1 | 8/2013 | Zhang et al. |
| 2013/0311848 | A1 | 11/2013 | Purohit |
| 2014/0068385 | A1 * | 3/2014 | Zhang .................. H04L 1/0041 714/776 |
| 2015/0095745 | A1 | 4/2015 | Hwang et al. |

FOREIGN PATENT DOCUMENTS

| | | |
|---|---|---|
| CN | 1901428 A | 1/2007 |
| CN | 101083651 A | 12/2007 |
| CN | 101142774 A | 3/2008 |
| CN | 101151835 A | 3/2008 |
| CN | 101288255 A | 10/2008 |
| CN | 101425871 A | 5/2009 |
| CN | 101467354 A | 6/2009 |
| CN | 101472201 A | 7/2009 |
| CN | 101523740 A | 9/2009 |
| CN | 101536389 A | 9/2009 |
| CN | 101582739 A | 11/2009 |
| CN | 101690240 A | 3/2010 |
| CN | 101690241 A | 3/2010 |
| CN | 101841389 A | 9/2010 |
| CN | 101888283 A | 11/2010 |
| CN | 101919175 A | 12/2010 |
| CN | 101939990 A | 1/2011 |
| CN | 102292982 A | 12/2011 |
| CN | 102301704 A | 12/2011 |
| CN | 102308577 A | 1/2012 |
| CN | 102783038 A | 11/2012 |
| CN | 102783050 A | 11/2012 |
| CN | 103199876 A | 7/2013 |
| CN | 103329514 A | 9/2013 |
| CN | 103354983 A | 10/2013 |
| EP | 0696108 A1 | 2/1996 |
| EP | 1341353 A1 | 9/2003 |
| WO | 2012050020 A1 | 4/2012 |
| WO | 2013053703 A1 | 4/2013 |
| WO | 2013066739 A1 | 5/2013 |
| WO | WO-2013126196 A1 * | 8/2013 .......... H04L 1/0057 |
| WO | 2015089877 A1 | 6/2015 |

OTHER PUBLICATIONS

IEEE P802 3bjtm/D2.2, Draft Standard for Ethernet Amendment X: Physical Layer Specifications and Management Parameters for 100 Gb/s Operation Over Backplanes and Copper Cables. Aug. 9, 2013, 356 pages.

* cited by examiner

| FEC0 | | | | FEC1 | | | | FEC2 | | | | FEC3 | | | |
|---|---|---|---|---|---|---|---|---|---|---|---|---|---|---|---|
| \multicolumn{4}{c}{L0/1/2/3} | \multicolumn{4}{c}{L4/5/6/7} | \multicolumn{4}{c}{L8/9/10/11} | \multicolumn{4}{c}{L12/13/14/15} |

| 004.1 | 005.1 | 006.1 | 007.1 | 104.1 | 105.1 | 106.1 | 107.1 | 204.1 | 205.1 | 206.1 | 207.1 | 304.1 | 305.1 | 306.1 | 307.1 |
|---|---|---|---|---|---|---|---|---|---|---|---|---|---|---|---|
| 004.0 | 005.0 | 006.0 | 007.0 | 104.0 | 105.0 | 106.0 | 107.0 | 204.0 | 205.0 | 206.0 | 207.0 | 304.0 | 305.0 | 306.0 | 307.0 |
| 000.9 | 001.9 | 002.9 | 003.9 | 100.9 | 101.9 | 102.9 | 103.9 | 200.9 | 201.9 | 202.9 | 203.9 | 300.9 | 301.9 | 302.9 | 303.9 |
| 000.8 | 001.8 | 002.8 | 003.8 | 100.8 | 101.8 | 102.8 | 103.8 | 200.8 | 201.8 | 202.8 | 203.8 | 300.8 | 301.8 | 302.8 | 303.8 |
| 000.7 | 001.7 | 002.7 | 003.7 | 100.7 | 101.7 | 102.7 | 103.7 | 200.7 | 201.7 | 202.7 | 203.7 | 300.7 | 301.7 | 302.7 | 303.7 |
| 000.6 | 001.6 | 002.6 | 003.6 | 100.6 | 101.6 | 102.6 | 103.6 | 200.6 | 201.6 | 202.6 | 203.6 | 300.6 | 301.6 | 302.6 | 303.6 |
| 000.5 | 001.5 | 002.5 | 003.5 | 100.5 | 101.5 | 102.5 | 103.5 | 200.5 | 201.5 | 202.5 | 203.5 | 300.5 | 301.5 | 302.5 | 303.5 |
| 000.4 | 001.4 | 002.4 | 003.4 | 100.4 | 101.4 | 102.4 | 103.4 | 200.4 | 201.4 | 202.4 | 203.4 | 300.4 | 301.4 | 302.4 | 303.4 |
| 000.3 | 001.3 | 002.3 | 003.3 | 100.3 | 101.3 | 102.3 | 103.3 | 200.3 | 201.3 | 202.3 | 203.3 | 300.3 | 301.3 | 302.3 | 303.3 |
| 000.2 | 001.2 | 002.2 | 003.2 | 100.2 | 101.2 | 102.2 | 103.2 | 200.2 | 201.2 | 202.2 | 203.2 | 300.2 | 301.2 | 302.2 | 303.2 |
| 000.1 | 001.1 | 002.1 | 003.1 | 100.1 | 101.1 | 102.1 | 103.1 | 200.1 | 201.1 | 202.1 | 203.1 | 300.1 | 301.1 | 302.1 | 303.1 |
| 000.0 | 001.0 | 002.0 | 003.0 | 100.0 | 101.0 | 102.0 | 103.0 | 200.0 | 201.0 | 202.0 | 203.0 | 300.0 | 301.0 | 302.0 | 303.0 |

Pre-interleaving

| EL0/1/2/3 | | | | EL4/5/6/7 | | | | EL8/9/10/11 | | | | EL12/13/14/15 | | | |
|---|---|---|---|---|---|---|---|---|---|---|---|---|---|---|---|
| 300.8 | 301.8 | 302.8 | 303.8 | 300.9 | 301.9 | 302.9 | 303.9 | 304.0 | 305.0 | 306.0 | 307.0 | 304.1 | 305.1 | 306.1 | 307.1 |
| 200.8 | 201.8 | 202.8 | 203.8 | 200.9 | 201.9 | 202.9 | 203.9 | 204.0 | 205.0 | 206.0 | 207.0 | 204.1 | 205.1 | 206.1 | 207.1 |
| 100.8 | 101.8 | 102.8 | 103.8 | 100.9 | 101.9 | 102.9 | 103.9 | 104.0 | 105.0 | 106.0 | 107.0 | 104.1 | 105.1 | 106.1 | 107.1 |
| 000.8 | 001.8 | 002.8 | 003.8 | 000.9 | 001.9 | 002.9 | 003.9 | 004.0 | 005.0 | 006.0 | 007.0 | 004.1 | 005.1 | 006.1 | 007.1 |
| 300.4 | 301.4 | 302.4 | 303.4 | 300.5 | 301.5 | 302.5 | 303.5 | 300.6 | 301.6 | 302.6 | 303.6 | 300.7 | 301.7 | 302.7 | 303.7 |
| 200.4 | 201.4 | 202.4 | 203.4 | 200.5 | 201.5 | 202.5 | 203.5 | 200.6 | 201.6 | 202.6 | 203.6 | 200.7 | 201.7 | 202.7 | 203.7 |
| 100.4 | 101.4 | 102.4 | 103.4 | 100.5 | 101.5 | 102.5 | 103.5 | 100.6 | 101.6 | 102.6 | 103.6 | 100.7 | 101.7 | 102.7 | 103.7 |
| 000.4 | 001.4 | 002.4 | 003.4 | 000.5 | 001.5 | 002.5 | 003.5 | 000.6 | 001.6 | 002.6 | 003.6 | 000.7 | 001.7 | 002.7 | 003.7 |
| 300.0 | 301.0 | 302.0 | 303.0 | 300.1 | 301.1 | 302.1 | 303.1 | 300.2 | 301.2 | 302.2 | 303.2 | 300.3 | 301.3 | 302.3 | 303.3 |
| 200.0 | 201.0 | 202.0 | 203.0 | 200.1 | 201.1 | 202.1 | 203.1 | 200.2 | 201.2 | 202.2 | 203.2 | 200.3 | 201.3 | 202.3 | 203.3 |
| 100.0 | 101.0 | 102.0 | 103.0 | 100.1 | 101.1 | 102.1 | 103.1 | 100.2 | 101.2 | 102.2 | 103.2 | 100.3 | 101.3 | 102.3 | 103.3 |
| 000.0 | 001.0 | 002.0 | 003.0 | 000.1 | 001.1 | 002.1 | 003.1 | 000.2 | 001.2 | 002.2 | 003.2 | 000.3 | 001.3 | 002.3 | 003.3 |

FIG. 11

FEC0
L0/1/2/3

| 004.1 | 005.1 | 006.1 | 007.1 |
|---|---|---|---|
| 004.0 | 005.0 | 006.0 | 007.0 |
| 000.9 | 001.9 | 002.9 | 003.9 |
| 000.8 | 001.8 | 002.8 | 003.8 |
| 000.7 | 001.7 | 002.7 | 003.7 |
| 000.6 | 001.6 | 002.6 | 003.6 |
| 000.5 | 001.5 | 002.5 | 003.5 |
| 000.4 | 001.4 | 002.4 | 003.4 |
| 000.3 | 001.3 | 002.3 | 003.3 |
| 000.2 | 001.2 | 002.2 | 003.2 |
| 000.1 | 001.1 | 002.1 | 003.1 |
| 000.0 | 001.0 | 002.0 | 003.0 |

FEC1
L4/5/6/7

| 104.1 | 105.1 | 106.1 | 107.1 |
|---|---|---|---|
| 104.0 | 105.0 | 106.0 | 107.0 |
| 100.9 | 101.9 | 102.9 | 103.9 |
| 100.8 | 101.8 | 102.8 | 103.8 |
| 100.7 | 101.7 | 102.7 | 103.7 |
| 100.6 | 101.6 | 102.6 | 103.6 |
| 100.5 | 101.5 | 102.5 | 103.5 |
| 100.4 | 101.4 | 102.4 | 103.4 |
| 100.3 | 101.3 | 102.3 | 103.3 |
| 100.2 | 101.2 | 102.2 | 103.2 |
| 100.1 | 101.1 | 102.1 | 103.1 |
| 100.0 | 101.0 | 102.0 | 103.0 |

FEC2
L8/9/10/11

| 204.1 | 205.1 | 206.1 | 207.1 |
|---|---|---|---|
| 204.0 | 205.0 | 206.0 | 207.0 |
| 200.9 | 201.9 | 202.9 | 203.9 |
| 200.8 | 201.8 | 202.8 | 203.8 |
| 200.7 | 201.7 | 202.7 | 203.7 |
| 200.6 | 201.6 | 202.6 | 203.6 |
| 200.5 | 201.5 | 202.5 | 203.5 |
| 200.4 | 201.4 | 202.4 | 203.4 |
| 200.3 | 201.3 | 202.3 | 203.3 |
| 200.2 | 201.2 | 202.2 | 203.2 |
| 200.1 | 201.1 | 202.1 | 203.1 |
| 200.0 | 201.0 | 202.0 | 203.0 |

FEC3
L12/13/14/15

| 304.1 | 305.1 | 306.1 | 307.1 |
|---|---|---|---|
| 304.0 | 305.0 | 306.0 | 307.0 |
| 300.9 | 301.9 | 302.9 | 303.9 |
| 300.8 | 301.8 | 302.8 | 303.8 |
| 300.7 | 301.7 | 302.7 | 303.7 |
| 300.6 | 301.6 | 302.6 | 303.6 |
| 300.5 | 301.5 | 302.5 | 303.5 |
| 300.4 | 301.4 | 302.4 | 303.4 |
| 300.3 | 301.3 | 302.3 | 303.3 |
| 300.2 | 301.2 | 302.2 | 303.2 |
| 300.1 | 301.1 | 302.1 | 303.1 |
| 300.0 | 301.0 | 302.0 | 303.0 |

Interleaving

EL:0/1/2/3

| 300.8 | 300.9 | 304.0 | 304.1 |
|---|---|---|---|
| 200.8 | 200.9 | 204.0 | 204.1 |
| 100.8 | 100.9 | 104.0 | 104.1 |
| 000.8 | 000.9 | 004.0 | 004.1 |
| 300.4 | 300.5 | 300.6 | 300.7 |
| 200.4 | 200.5 | 200.6 | 200.7 |
| 100.4 | 100.5 | 100.6 | 100.7 |
| 000.4 | 000.5 | 000.6 | 000.7 |
| 300.0 | 300.1 | 300.2 | 300.3 |
| 200.0 | 200.1 | 200.2 | 200.3 |
| 100.0 | 100.1 | 100.2 | 100.3 |
| 000.0 | 000.1 | 000.2 | 000.3 |

EL:4/5/6/7

| 301.8 | 301.9 | 305.0 | 305.1 |
|---|---|---|---|
| 201.8 | 201.9 | 205.0 | 205.1 |
| 101.8 | 101.9 | 105.0 | 105.1 |
| 001.8 | 001.9 | 005.0 | 005.1 |
| 301.4 | 301.5 | 301.6 | 301.7 |
| 201.4 | 201.5 | 201.6 | 201.7 |
| 101.4 | 101.5 | 101.6 | 101.7 |
| 001.4 | 001.5 | 001.6 | 001.7 |
| 301.0 | 301.1 | 301.2 | 301.3 |
| 201.0 | 201.1 | 201.2 | 201.3 |
| 101.0 | 101.1 | 101.2 | 101.3 |
| 001.0 | 001.1 | 001.2 | 001.3 |

EL:8/9/10/11

| 302.8 | 302.9 | 306.0 | 306.1 |
|---|---|---|---|
| 202.8 | 202.9 | 206.0 | 206.1 |
| 102.8 | 102.9 | 106.0 | 106.1 |
| 002.8 | 002.9 | 006.0 | 006.1 |
| 302.4 | 302.5 | 302.6 | 302.7 |
| 202.4 | 202.5 | 202.6 | 202.7 |
| 102.4 | 102.5 | 102.6 | 102.7 |
| 002.4 | 002.5 | 002.6 | 002.7 |
| 302.0 | 302.1 | 302.2 | 302.3 |
| 202.0 | 202.1 | 202.2 | 202.3 |
| 102.0 | 102.1 | 102.2 | 102.3 |
| 002.0 | 002.1 | 002.2 | 002.3 |

EL:12/13/14/15

| 303.8 | 303.9 | 307.0 | 307.1 |
|---|---|---|---|
| 203.8 | 203.9 | 207.0 | 207.1 |
| 103.8 | 103.9 | 107.0 | 107.1 |
| 003.8 | 003.9 | 007.0 | 007.1 |
| 303.4 | 303.5 | 303.6 | 303.7 |
| 203.4 | 203.5 | 203.6 | 203.7 |
| 103.4 | 103.5 | 103.6 | 103.7 |
| 003.4 | 003.5 | 003.6 | 003.7 |
| 303.0 | 303.1 | 303.2 | 303.3 |
| 203.0 | 203.1 | 203.2 | 203.3 |
| 103.0 | 103.1 | 103.2 | 103.3 |
| 003.0 | 003.1 | 003.2 | 003.3 |

FIG. 12

DATA SENDING AND RECEIVING METHOD AND DEVICE

CROSS-REFERENCE TO RELATED APPLICATIONS

This application is a continuation of U.S. patent application Ser. No. 17/511,303, filed on Oct. 26, 2021, which is a continuation of U.S. patent application Ser. No. 17/003,938, filed on Aug. 26, 2020, now U.S. Pat. No. 11,356,203, which is a continuation of U.S. patent application Ser. No. 16/374,414, filed on Apr. 3, 2019, now U.S. Pat. No. 10,797,828, the U.S. patent application Ser. No. 16/374,414 is a continuation of U.S. patent application Ser. No. 15/186,040, filed on Jun. 17, 2016, now U.S. Pat. No. 10,291,358, which is a continuation of International Application No. PCT/CN2014/094081, filed on Dec. 17, 2014. The International Application claims priority to International Application No. PCT/CN2013/090803, filed on Dec. 28, 2013 and International Application No. PCT/CN2013/089697, filed on Dec. 17, 2013. All of the aforementioned patents and patent applications are hereby incorporated by reference in their entireties.

TECHNICAL FIELD

The present invention relates to the field of communications, and in particular, to a data receiving method and device, and a data sending method and device.

BACKGROUND

With the development of the Internet, traffic of a telecommunications backbone network is rapidly growing by 50% to 80% each year. At the beginning of the year 2011, the IEEE 802.3 working group started to collect a bandwidth development requirement after a 100GE Ethernet interface. With regard to the development of network bandwidth in the future, the IEEE 802.3 working group considered that network traffic in the year 2015 could reach 10 times what it was in the year 2010. According to a preliminary analysis, there would be two rates of 400GE/1TE for an Ethernet interface in the future, and such requirements would appear and begin to be applied in the year 2015 and the year 2020, respectively.

As a transmission rate increases, a high frequency loss of a signal on a high-speed transmission link increases; therefore, intersymbol interference affects an indicator such as signal quality or a bit error rate. However, currently, a decision feedback equalizer (English full name: decision feedback equalizer, English acronym: DFE) is universally used on a receive side of a high-speed interface, which embodies distortion caused by white noise on the link in a form of an error burst. Therefore, the industry begins to study how to perform error correction on a bit error in the Ethernet by using an FEC algorithm.

In the prior art, an interleaver (English: Interleaver) in a sending device writes by row and then reads by column a section of data on which FEC encoding has been performed. The sending device then sends, to a receiving device, the data read by column. For example, when data 1 on which the FEC encoding has been performed includes data units U0 to U4, and data 2 on which the FEC encoding has been performed includes data units U5 to U9, the 10 data units are written by row, and it is set that each row includes five data units, and then written data is shown in Table 1.

TABLE 1

| U4 | U3 | U2 | U1 | U0 |
| U9 | U8 | U7 | U6 | U5 |

The data shown in Table 1 is read by column, and then data shown in Table 2 can be obtained.

TABLE 2

| U9 | U4 | U8 | U3 | U7 | U2 | U6 | U1 | U5 | U0 |

The data read by column is sent to the receiving device. The receiving device performs an operation inverse to that of the sending device on the received data, and in a normal case, the data shown in Table 1 can be obtained again.

During a transmission process, a bit error may occur in the data read by column and shown in Table 2, for example, a bit error occurs in the three successive data units U6, U2, and U7. The receiving device restores an arrangement order of the data units in Table 3 to that shown in Table 1. Therefore, the three successive data units U6, U2, and U7 are not successive any longer. In other words, a probability that multiple error codes occur in one code word decreases. In this way, error correction pressure of an FEC unit in the receiving device can be reduced to some extent.

However, in the foregoing method, such a special interleaving manner of writing by row and reading by column needs to be performed. In this interleaving manner, a section of data needs to be written before the section of data begins to be read, which generates an obvious delay.

SUMMARY

An objective of embodiments of the present invention is to provide a data sending method and a data receiving method, and a corresponding sending device and a corresponding receiving device, to correct a bit error generated during a data transmission process.

The technical solutions of the embodiments of the present invention include:

According to a first aspect, a data sending method includes:

sending, by a first forward error correction FEC unit of a sending device, by using a first channel, a first data stream on which first FEC encoding has been performed, where the first data stream includes a channel identifier of the first channel;

sending, by a second FEC unit of the sending device, by using a second channel, a second data stream on which second FEC encoding has been performed, where the second data stream includes a channel identifier of the second channel;

performing interleaving, by the sending device, on the first data stream and the second data stream, to obtain an output data stream; and sending the output data stream to a receiving device. Optionally, the first FEC encoding may be performed by the first FEC unit or another FEC unit, and the second FEC encoding may be performed by the second FEC unit or another FEC unit.

In a first implementation manner of the first aspect, the method further includes:

sending, by the first FEC unit, by using a third channel, a third data stream on which third FEC encoding has been performed, where the third data stream includes a channel identifier of the third channel; and sending, by the second FEC unit, by using a fourth channel, a fourth data stream on which fourth FEC encoding has been performed, where the fourth data stream includes a channel identifier of the fourth channel. The first implementation manner of the first aspect is based on the first aspect.

In a second implementation manner of the first aspect, the performing interleaving, by the sending device, on the first data stream and the second data stream, to obtain an output data stream specifically includes:

performing first interleaving, by the sending device, on the first data stream and the second data stream;

performing second interleaving, by the sending device, on the third data stream and the fourth data stream; and performing third interleaving on a data stream that is obtained by performing the first interleaving and a data stream that is obtained by performing the second interleaving, to obtain the output data stream;

or, performing first interleaving, by the sending device, on the first data stream and the second data stream; and performing second interleaving, by the sending device, on the third data stream and the fourth data stream, where the output data stream includes a data stream that is obtained by performing the first interleaving and a data stream that is obtained by performing the second interleaving.

The second implementation manner of the first aspect is based on the first implementation manner of the first aspect.

In a third implementation manner of the first aspect, for the first interleaving, the interleaving is performed according to a first data unit, for the second interleaving, the interleaving is performed according to a second data unit, where the first data unit includes at least two bits, and the second data unit includes at least two bits, and for the third interleaving, the interleaving is performed according to a bit.

Preferably, performing interleaving according to a data unit refers to dividing, according to a length of the data unit, each of at least two to-be-interleaved data streams into data blocks, and then performing the interleaving on the obtained data blocks, where the length of the data unit refers to the number of bits included in the data unit.

According to a second aspect, a data receiving method includes:

receiving, by a receiving device, a first data stream from a sending device;

performing de-interleaving on the first data stream, to obtain a second data stream and a third data stream;

determining that the second data stream includes a first channel identifier and the third data stream includes a second channel identifier, where the first channel identifier is a channel identifier of a first channel that is connected to a first FEC unit in the sending device, and the second channel identifier is a channel identifier of a second channel that is connected to a second FEC unit in the sending device;

determining, according to the first channel identifier and a first correspondence that is configured in the receiving device, a third channel identifier corresponding to the first channel identifier, where the first correspondence includes a correspondence between the first channel identifier and the third channel identifier, and the third channel identifier is a channel identifier of a third channel that is connected to a third FEC unit in the receiving device;

sending the second data stream to the third FEC unit in the receiving device by using the third channel, for FEC decoding;

determining, according to the second channel identifier and a second correspondence that is configured in the receiving device, a fourth channel identifier corresponding to the second channel identifier, where the second correspondence includes a correspondence between the second channel identifier and the fourth channel identifier, and the fourth channel identifier is a channel identifier of a fourth channel that is connected to a fourth FEC unit in the receiving device; and sending the third data stream to the fourth FEC unit in the receiving device by using the fourth channel, for FEC decoding.

Optionally, the sending the second data stream to the third FEC unit in the receiving device by using the third channel, for FEC decoding may refer to performing FEC decoding by the third FEC unit or forwarding, by the third FEC unit, the second data stream to another FEC unit, for the another FEC unit to perform decoding.

In a first implementation manner of the second aspect, the performing de-interleaving on the first data stream, to obtain a second data stream and a third data stream specifically includes:

performing first de-interleaving on the first data stream, to obtain a fourth data stream and a fifth data stream; and performing second de-interleaving on the fourth data stream, obtaining the second data stream and the third data stream according to the fourth data stream, performing third de-interleaving on the fifth data stream, and obtaining a sixth data stream and a seventh data stream according to the fifth data stream, where the sixth data stream includes a fifth channel identifier, the fifth channel identifier is a channel identifier of a fifth channel that is connected to the first FEC unit in the sending device, the seventh data stream includes a sixth channel identifier, and the sixth channel identifier is a channel identifier of a sixth channel that is connected to the second FEC unit in the sending device.

In a second implementation manner of the second aspect, the method further includes:

determining, according to the fifth channel identifier and a third correspondence that is configured in the receiving device, a seventh channel identifier corresponding to the fifth channel identifier, where the third correspondence includes a correspondence between the fifth channel identifier and the seventh channel identifier, and the seventh channel identifier is a channel identifier of a seventh channel that is connected to the third FEC unit in the receiving device;

sending the sixth data stream to the third FEC unit in the receiving device by using the seventh channel, for FEC decoding;

determining, according to the sixth channel identifier and a fourth correspondence that is configured in the receiving device, an eighth channel identifier corresponding to the sixth channel identifier, where the fourth correspondence includes a correspondence between the sixth channel identifier and the eighth channel identifier, and the eighth channel identifier is a channel identifier of an eighth channel that is connected to the fourth FEC unit in the receiving device; and sending the seventh data stream to the fourth FEC unit in the receiving device by using the eighth channel, for FEC decoding. The second implementation manner of the second aspect is based on the first implementation manner of the second aspect.

In a third implementation manner of the second aspect, for the first de-interleaving, the de-interleaving is performed according to a bit, for the second de-interleaving, the de-interleaving is performed according to a first data unit, and for the third de-interleaving, the de-interleaving is performed according to a second data unit, where the first data unit includes at least two bits, and the second data unit includes at least two bits. The third implementation manner of the second aspect is based on the first implementation manner of the second aspect or the second implementation manner of the second aspect.

According to a third aspect, a sending device includes:

a first forward error correction FEC unit, configured to send, by using a first channel, a first data stream on which first FEC encoding has been performed, where the first data stream includes a channel identifier of the first channel;

a second FEC unit, configured to send, by using a second channel, a second data stream on which second FEC encoding has been performed, where the second data stream includes a channel identifier of the second channel;

an interleaving unit, configured to perform interleaving on the first data stream and the second data stream, to obtain an output data stream; and a sending unit, configured to send the output data stream to a receiving device.

In a first implementation manner of the third aspect, the first FEC unit is further configured to send, by using a third channel, a third data stream on which third FEC encoding has been performed, where the third data stream includes a channel identifier of the third channel; and the second FEC unit is further configured to send, by using a fourth channel, a fourth data stream on which fourth FEC encoding has been performed, where the fourth data stream includes a channel identifier of the fourth channel. The first implementation manner of the third aspect is based on the third aspect.

In a second implementation manner of the third aspect, the interleaving unit is specifically configured to:

perform first interleaving on the first data stream and the second data stream;

perform second interleaving on the third data stream and the fourth data stream; and perform third interleaving on a data stream that is obtained by performing the first interleaving and a data stream that is obtained by performing the second interleaving, to obtain the output data stream;

or, perform first interleaving on the first data stream and the second data stream; and perform second interleaving on the third data stream and the fourth data stream, where the output data stream includes a data stream that is obtained by performing the first interleaving and a data stream that is obtained by performing the second interleaving. The second implementation manner of the third aspect is based on the first implementation manner of the third aspect.

In a third implementation manner of the third aspect, for the first interleaving, the interleaving is performed according to a first data unit, for the second interleaving, the interleaving is performed according to a second data unit, where the first data unit includes at least two bits, and the second data unit includes at least two bits, and for the third interleaving, the interleaving is performed according to a bit. The third implementation manner of the third aspect is based on the second implementation manner of the third aspect.

According to a fourth aspect, a receiving device includes:

a receiving unit, configured to receive a first data stream from a sending device;

a de-interleaving unit, configured to perform de-interleaving on the first data stream, to obtain a second data stream and a third data stream; and a determining unit, configured to:

determine that the second data stream includes a first channel identifier and the third data stream includes a second channel identifier, where the first channel identifier is a channel identifier of a first channel that is connected to a first FEC unit in the sending device, and the second channel identifier is a channel identifier of a second channel that is connected to a second FEC unit in the sending device;

determine, according to the first channel identifier and a first correspondence that is configured in the receiving device, a third channel identifier corresponding to the first channel identifier, where the first correspondence includes a correspondence between the first channel identifier and the third channel identifier, and the third channel identifier is a channel identifier of a third channel that is connected to a third FEC unit in the receiving device, and send the second data stream to the third FEC unit in the receiving device by using the third channel, for FEC decoding; and determine, according to the second channel identifier and a second correspondence that is configured in the receiving device, a fourth channel identifier corresponding to the second channel identifier, where the second correspondence includes a correspondence between the second channel identifier and the fourth channel identifier, and the fourth channel identifier is a channel identifier of a fourth channel that is connected to a fourth FEC unit in the receiving device, and send the third data stream to the fourth FEC unit in the receiving device by using the fourth channel, for FEC decoding.

In a first implementation manner of the fourth aspect, the de-interleaving unit is specifically configured to:

perform first de-interleaving on the first data stream, to obtain a fourth data stream and a fifth data stream; and perform second de-interleaving on the fourth data stream, obtain the second data stream and the third data stream according to the fourth data stream, perform third de-interleaving on the fifth data stream, and obtain a sixth data stream and a seventh data stream according to the fifth data stream, where the sixth data stream includes a fifth channel identifier, the fifth channel identifier is a channel identifier of a fifth channel that is connected to the first FEC unit in the sending device, the seventh data stream includes a sixth channel identifier, and the sixth channel identifier is a channel identifier of a sixth channel that is connected to the second FEC unit in the sending device. The first implementation manner of the fourth aspect is based on the fourth aspect.

In a second implementation manner of the fourth aspect, the determining unit is further configured to:

determine, according to the fifth channel identifier and a third correspondence that is configured in the receiving device, a seventh channel identifier corresponding to the fifth channel identifier, where the third correspondence includes a correspondence between the fifth channel identifier and the seventh channel identifier, and the seventh channel identifier is a channel identifier of a seventh channel that is connected to the third FEC unit in the receiving device, and send the sixth data stream to the third FEC unit in the receiving device by using the seventh channel, for FEC decoding; and determine, according to the sixth channel identifier and a fourth correspondence that is configured in the receiving device, an eighth channel identifier corresponding to the sixth channel identifier, where the fourth correspondence includes a correspondence between the sixth channel identifier and the eighth channel identifier, and the eighth channel identifier is a channel identifier of an eighth channel that is connected to the fourth FEC unit in the receiving device, and send the seventh data stream to the fourth FEC unit in the receiving device by using the eighth channel, for FEC decoding. The second implementation manner of the fourth aspect is based on the first implementation manner of the fourth aspect.

In a third implementation manner of the fourth aspect, for the first de-interleaving, the de-interleaving is performed according to a bit, for the second de-interleaving, the de-interleaving is performed according to a first data unit, and for the third de-interleaving, the de-interleaving is performed according to a second data unit, where the first data unit includes at least two bits, and the second data unit includes at least two bits. The third implementation manner of the fourth aspect is based on the first implementation manner of the fourth aspect or the second implementation manner of the fourth aspect.

An advantage according to one aspect of the present invention lies in that, a receiving device can send, to different FEC units of the receiving device, data units in which an error occurs; therefore, a case in which error correction is performed by using only one FEC unit can be prevented to a great extent. In this case, for an FEC unit, the number of bit errors received by the FEC unit decreases. In other words, a probability that the FEC unit performs error correction successfully increases. On the whole, when success rates of error correction of one or more FEC units in the receiving device increase, an error correction capability of the receiving device is improved. In addition, in this embodiment, an interleaving manner of writing by row and reading by column is not needed; therefore, no delay is generated.

BRIEF DESCRIPTION OF DRAWINGS

FIG. 11 is a schematic diagram of performing one type of interleaving according to an embodiment of the present invention;

FIG. 12 is a schematic diagram of performing another type of interleaving according to an embodiment of the present invention;

DESCRIPTION OF EMBODIMENTS

The following describes the present invention in detail with reference to the accompanying drawings and specific embodiments. However, it should be noted that, the following embodiments are only examples given for ease of understanding the technical solutions, and are not intended to limit the present invention.

Figure 1:
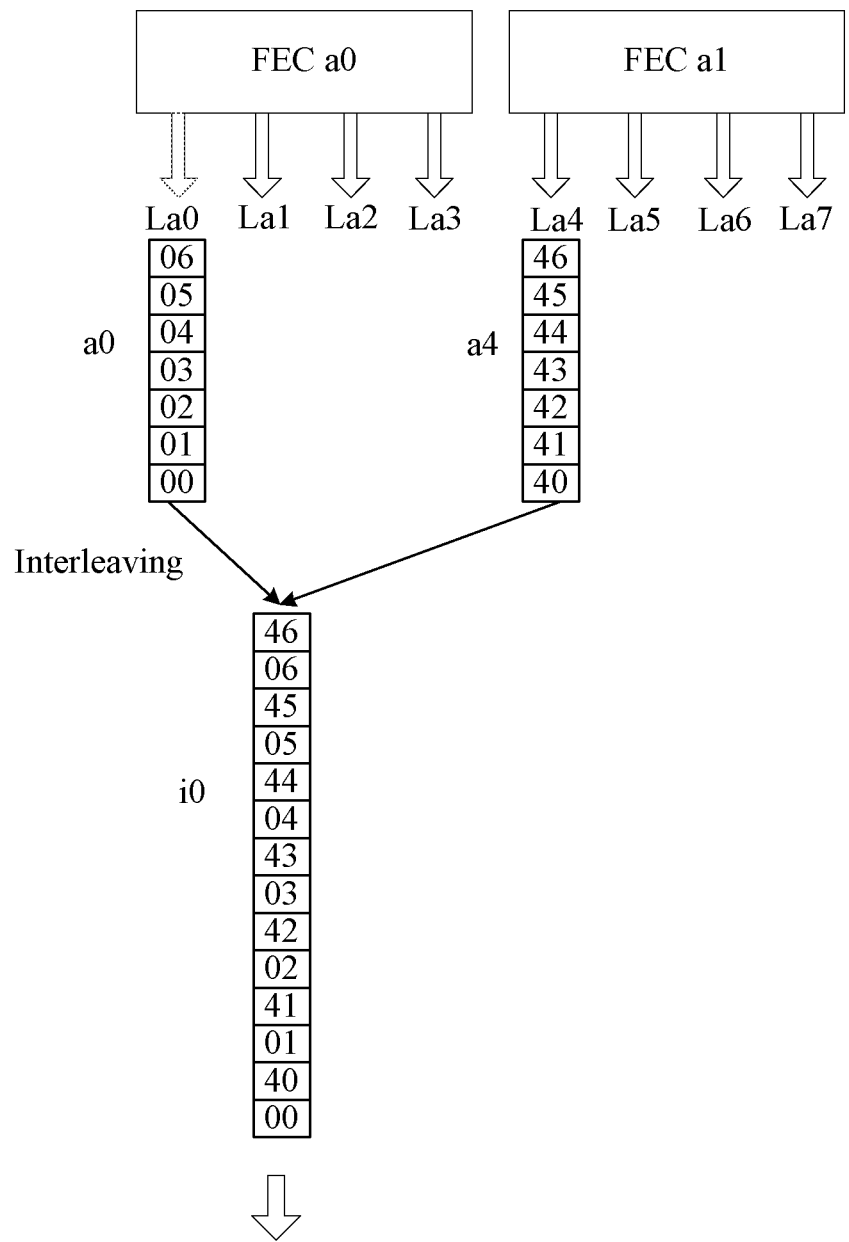
FIG. 1 is a schematic diagram of data sending according to an embodiment of the present invention.

An embodiment of the present invention provides a data sending method. The method is performed by a sending device, and the sending device includes at least two forward error correction (English full name: Forward Error Correction, English acronym: FEC) units, for example, an FECa0 and an FECa1 that are shown in FIG. 1. Optionally, the sending device may further include one or more other FEC units.

In this embodiment, each FEC unit may have at least one channel, and the channel is used to output data on which FEC encoding has been performed by an FEC unit connected to this channel. For example, the FECa0 in FIG. 1 includes channels La0 to La3, and the FECa1 includes channels La4 to La7. The four channels La0 to La3 are used to output a data stream encoded by the FECa0, and the four channels La4 to La7 are used to output a data stream encoded by the FECa1. When at least two channels are connected to one FEC unit, the at least two channels may output data at the same time, or some of the at least two channels may output data. A data stream output by each channel may include a channel identifier of the channel, for example, a data stream a0 output by the channel La0 includes a channel identifier of the channel La0, and a data stream a4 output by the channel La4 includes a channel identifier of the channel La4. Optionally, one channel identifier uniquely identifies one channel in the sending device.

Encoding rules used by different FEC units may be the same or different. In addition, FEC encoding rules for data streams output by different channels of a same FEC unit may be the same or different. For example, an FEC encoding rule for the data stream a0 may be the same as or different from an FEC encoding rule for the data stream a4. The encoding rule for the data stream a0 may be the same as or different from an encoding rule for a data stream a1, and the data stream a1 refers to a data stream output from the channel La1.

In this embodiment, as shown in FIG. 1, the data stream a0 output by the channel La0 connected to the FECa0 includes data units 00 to 06, the data stream a4 output by the channel La4 connected to the FECa1 includes data units 40 to 46, and in the 14 data units, a length of each data unit may be one bit (English: bit) or multiple bits. Preferably, the lengths of the data units should be the same. When one data unit includes at least two bits, the data unit may be referred to as a symbol (English: symbol).

Interleaving is performed on the data stream a0 and the data stream a4, to obtain a data stream i0. It should be noted that, the data stream i0 may be one data stream or two or more data streams.

When the data stream i0 is one data stream, as shown in FIG. 1, the data stream i0 obtained after the interleaving includes the seven data units: the data units 00 to 06, and further includes the seven data units: the data units 40 to 46, and an order of the 14 data units is shown in FIG. 1. As shown in FIG. 1, two adjacent data units in the data stream i0 are from different data streams. Preferably, in the data stream i0, an order of data units that are from a same data stream is the same as that of these data units in an original data stream, for example, as shown in FIG. 1, in the data stream i0, an order of the data units 00 to 06 that are from the data stream a0 is the same as that of the seven data units 00 to 06 in the data stream a0.

Figure 2:
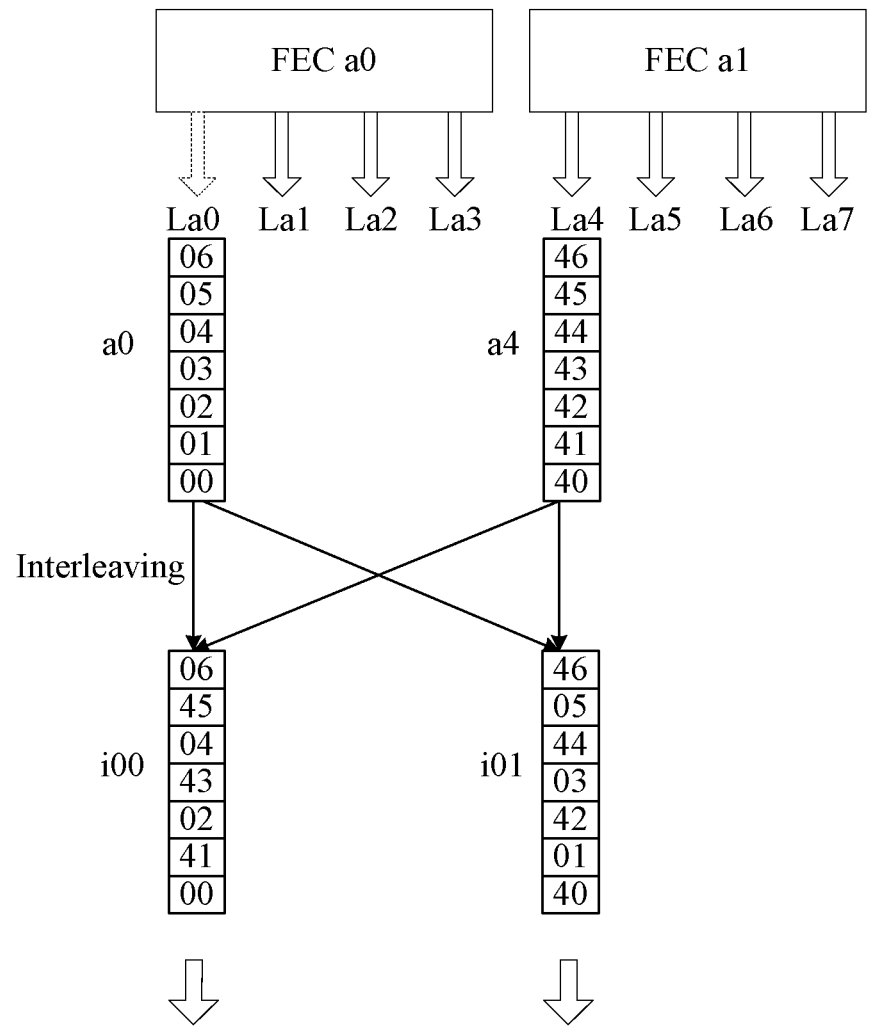
FIG. 2 is a schematic diagram of data sending according to an embodiment of the present invention.

When the data stream i0 includes two data streams, as shown in FIG. 2, the data stream i0 obtained after the interleaving includes a data stream i00 and a data stream i01. The data stream i00 includes the data unit 00 and the data units 41, 02, 43, 04, 45, and 06 that are arranged in order, and the data stream i01 includes the data units 40, 01, 42, 03, 44, 05, and 46 that are arranged in order.

When the data stream i0 is two data streams, the sending device may not continue to perform the interleaving on the two data streams, and may send the data stream i00 and the data stream i01 as two data streams to a receiving device.

When the interleaving is performed on a data stream 1 and a data stream 2, to obtain a data stream 3, in the data stream 3, an arrangement order of data units that are from the data stream 1 should be the same as that of these data units in the data stream 1, and an arrangement order of data units that are from the data stream 2 should be the same as that of these data units in the data stream 2. Using FIG. 1 as an example, the data units 00, 01, and 02 are from the data stream a0, and an arrangement order of the three data units in the data stream a0 is that the data unit 01 is after the data unit 00, and the data unit 02 is after the data unit 01. In the data stream i0 obtained after the interleaving, the data unit 01 is still after the data unit 00, and the data unit 02 is still after the data unit 01.

In addition, it should be noted that, for the interleaving, the interleaving may be performed based on one data unit or multiple data units. Interleaving methods shown in FIG. 1 and FIG. 2 are based on one data unit, and in a data stream after the interleaving, two adjacent data units are from different data streams, for example, the data unit 00 and the data unit 40 are from different data streams. If the interleaving is performed based on two data units, using that the interleaving is performed on the first six data units in the data stream a0 and the first six data units in the data stream a4 in FIG. 1 for example, an arrangement order of the data units in a data stream obtained after the interleaving may be the data units 00-01-40-41-02-03-42-43-04-05-44-45.

An interleaving operation in this embodiment is performed by an interleaving unit, and the interleaving unit may be one or more hardware chips or processors, or some of logical functions in one hardware chip or processor.

In this embodiment, an interleaving unit of a sending device performs interleaving on at least two data streams encoded by different FEC units, and a sending unit in the sending device sends data obtained through the interleaving to a receiving device. In this way, the receiving device can perform de-interleaving on a data stream after the interleaving, and send at least two data streams obtained through the de-interleaving to different FEC units for decoding. When a bit error occurs during a transmission process of the data stream obtained through the interleaving, the data streams obtained after the de-interleaving are sent to the different FEC units for decoding. Therefore, for an FEC unit, the number of bit errors received by the FEC unit decreases. In other words, a probability that the FEC unit performs error correction successfully increases. On the whole, when success rates of error correction of one or more FEC units in the receiving device increase, an error correction capability of the receiving device is improved. In addition, in this embodiment, an interleaving manner of writing by row and reading by column is not needed; therefore, no delay is generated. In addition, an interleaver that implements the interleaving manner of writing by row and reading by column is complex in design and consumes much power. In this embodiment, such a special interleaver is not needed; therefore, the implementation is simple and power consumption of a device is reduced. To sum up, the data sending method in this embodiment helps implement a simple, energy-saving, and efficient error correction method.

Figure 3:
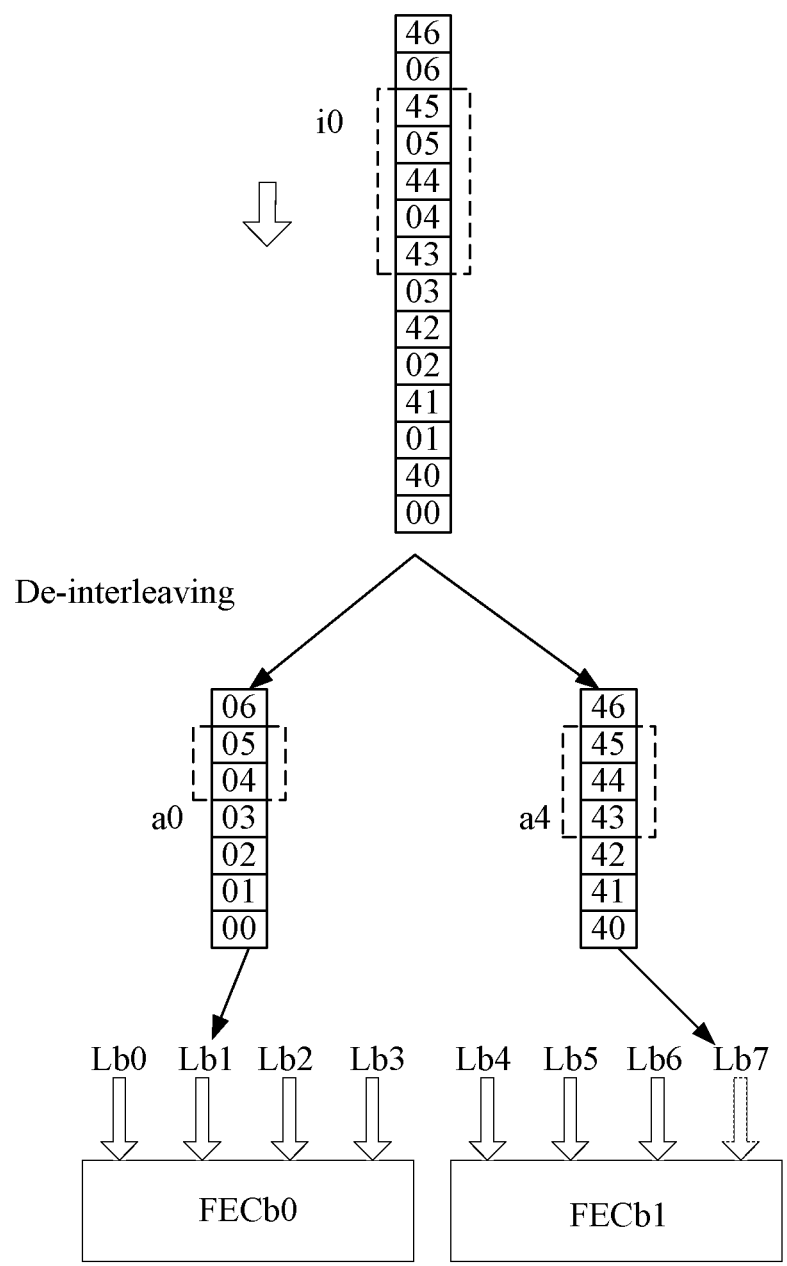
FIG. 3 is a schematic diagram of data receiving according to an embodiment of the present invention.

An embodiment of the present invention provides a data receiving method. The method is performed by a receiving device, and the receiving device includes at least two FEC units, for example, an FECb1 and an FECb2 that are shown in FIG. 3. Optionally, the sending device may further include one or more other FEC units.

A receiving unit in the receiving device receives a first data stream from a sending device.

The first data stream in this embodiment may be one data stream or two or more data streams.

As shown in FIG. 3, when the first data stream is the data stream i0 shown in FIG. 1, the data stream i0 is de-interleaved by a de-interleaving unit in the receiving device into a data stream a0 and a data stream a4. In a case in which no fault occurs, the data stream a0 in FIG. 3 is the same as the data stream a0 in FIG. 1, and the data stream a4 in FIG. 3 is the same as the data stream a4 in FIG. 1. The data stream a0 in FIG. 1 includes the channel identifier of the channel La0, and the data stream a4 includes the channel identifier of the channel La4; therefore, the data stream a0 in FIG. 3 should also include the channel identifier of the channel La0, and the data stream a4 in FIG. 3 should also include the channel identifier of the channel La4.

A determining unit in the receiving device determines that the data stream a0 includes the channel identifier of the channel La0 and the data stream a4 includes the channel identifier of the channel La4.

When the receiving device can determine that the data stream a0 includes the channel identifier of the channel La0 and the data stream a4 includes the channel identifier of the channel La4, it indicates that the data stream a0 obtained through the de-interleaving by the receiving device includes the channel identifier of the La0, and a data stream a1 obtained through the de-interleaving includes a channel identifier of an La1. Further, the receiving device may determine that the data stream i0 is a data stream that is obtained after interleaving processing. This is because, if the data stream i0 is not acquired by performing interleaving processing, data streams obtained after the de-interleaving is forcibly performed on the data stream i0 may be disordered, and the receiving device cannot determine the channel identifier of the La0 or the channel identifier of the La1 from the disordered data streams. In addition, when one channel is connected to one FEC unit, it may be determined that a data stream that includes a channel identifier of the channel is from the FEC unit, that is, FEC encoding has been performed on the data stream.

The receiving device determines, according to the channel identifier of the channel La0 and a correspondence 1, a channel in the receiving device and corresponding to the channel La0. In this embodiment, the correspondence 1 includes a correspondence between the channel identifier of the channel La0 and a channel identifier of a channel Lb1. Therefore, the receiving device determines that the channel Lb1 is a channel corresponding to the channel La0, thereby determining that the data stream a0 needs to be sent by using the channel Lb1. As shown in FIG. 3, the data stream a0 is sent, by using the channel Lb1, to an FECb0 connected to the channel Lb1.

Similarly, the receiving device determines, according to the channel identifier of the channel La4 and a correspondence 2, a channel in the receiving device and corresponding to the channel La4. In this embodiment, the correspondence 2 includes a correspondence between the channel identifier of the channel La4 and a channel identifier of a channel Lb7. Therefore, the receiving device determines that the channel Lb7 is a channel corresponding to the channel La0, thereby determining that the data stream a4 needs to be sent by using the channel Lb7. As shown in FIG. 3, the data stream a4 is sent, by using the channel Lb7, to an FECb1 connected to the channel Lb7.

As shown in FIG. 3, when an error occurs in data units 43, 04, 44, 05, and 45 in the data stream i0 received by the receiving device, the receiving device de-interleaves the data stream i0 by using the de-interleaving unit, to obtain the data streams a0 and a4 that are shown in FIG. 3. Therefore, the data units 04 and 05 in which the error occurs are sent to the FECb0, and the data units 43, 44, and 45 in which the error occurs are sent to the FECb1. The data units in which the error occurs are sent to different FEC units. Therefore, for an FEC unit, the number of bit errors received by the FEC unit decreases. In other words, a probability that the FEC unit performs error correction successfully increases. On the whole, when success rates of error correction of one or more FEC units in the receiving device increase, an error correction capability of the receiving device is improved. In addition, in this embodiment, an interleaving manner of writing by row and reading by column is not needed; therefore, no delay is generated. In addition, an interleaver that implements the interleaving manner of writing by row and reading by column is complex in design and consumes much power. In this embodiment, such a special interleaver is not needed; therefore, the implementation is simple and power consumption of a device is reduced.

Figure 4:
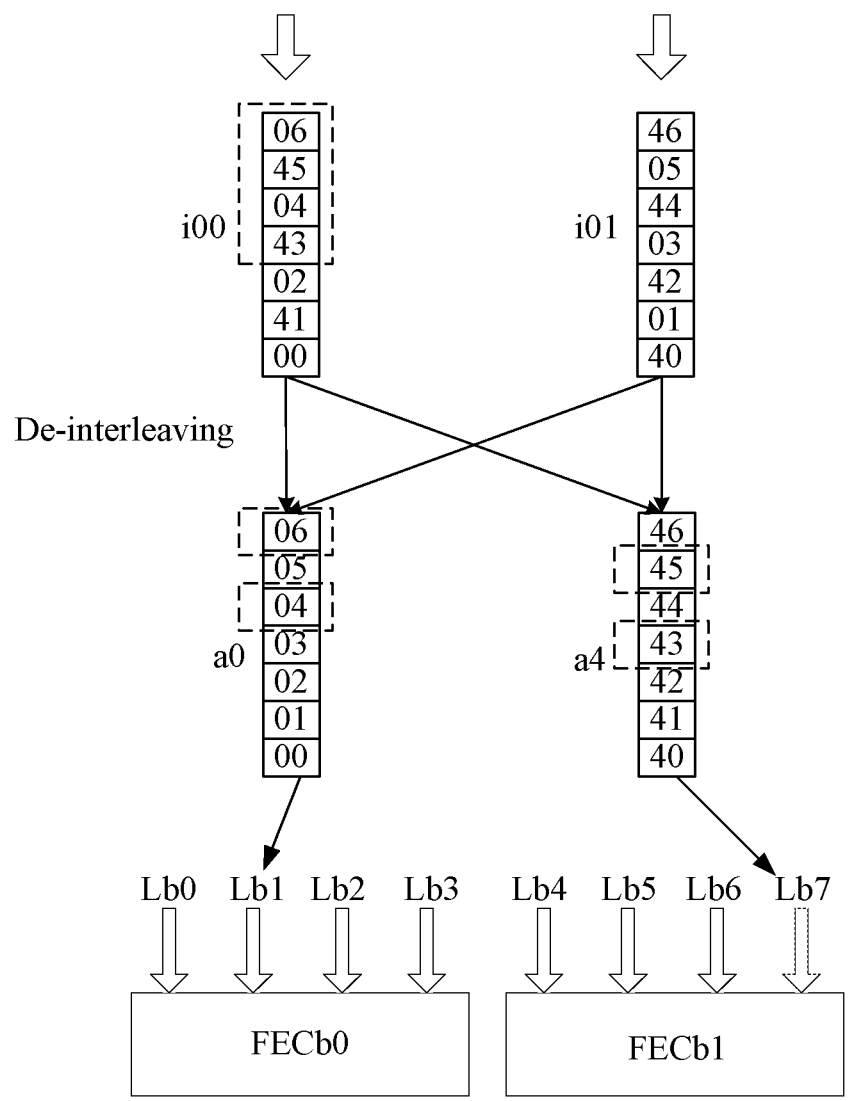
FIG. 4 is a schematic diagram of data receiving according to an embodiment of the present invention.

When the first data stream is the data streams i00 and i01 shown in FIG. 2, as shown in FIG. 4, the data streams i00 and i01 are de-interleaved by the de-interleaving unit in the receiving device into the data stream a0 and the data stream a4.

Operations that are performed by the receiving device after obtaining the data stream a0 and the data stream a4 are the same as those in the embodiment corresponding to FIG. 3, that is, determining the channel identifier of the channel La0 from the data stream a0, and determining the channel identifier of the channel La4 from the data stream a4; and then, determining, according to the channel identifier of the channel La0, that the channel Lb1 is a channel corresponding to the channel La0, and determining, according to the channel identifier of the channel La4, that the channel Lb7 is a channel corresponding to the channel La4. In this way, the receiving device may send the data stream a0 to the FECb0 by using the channel Lb1 for processing, and send the data stream a1 to the FECb1 by using the channel Lb7 for processing.

An embodiment of the present invention includes a process during which a sending device sends data to a receiving device, and the receiving device performs corresponding receiving.

Figure 5:
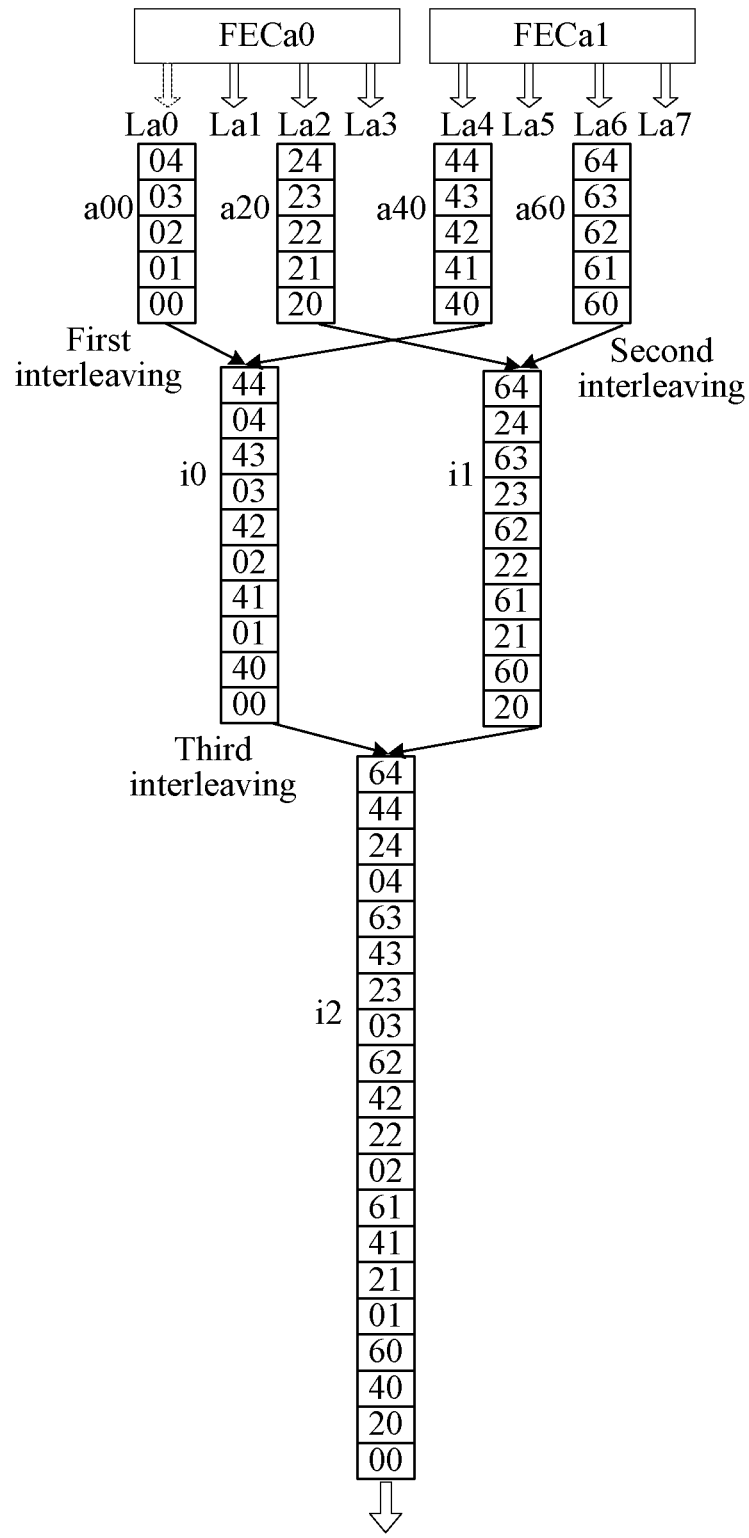
FIG. 5 is a schematic diagram of data sending according to an embodiment of the present invention.

As shown in FIG. 5, the sending device includes two FEC units, which are an FECa0 and an FECa1, respectively. In FIG. 5, the FECa0 includes channels La0 to La3, and the FECa1 includes channels La4 to La7. The four channels La0 to La3 are used to output a data stream encoded by the FECa0, and the four channels La4 to La7 are used to output a data stream encoded by the FECa1.

As shown in FIG. 5, the channel La0 outputs a data stream a00, the channel La2 outputs a data stream a20, the channel La4 outputs a data stream a40, and the channel La6 outputs a data stream a60. The data stream a00 includes five data units: data units 00 to 04 that are arranged in order, the data stream a20 includes five data units: data units 20 to 24 that are arranged in order, the data stream a40 includes five data units: data units 40 to 44 that are arranged in order, and the data stream a60 includes five data units: data units 60 to 64 that are arranged in order. The data stream a00 includes a channel identifier of the channel La0, the data stream a20 includes a channel identifier of the channel La2, the data stream a40 includes a channel identifier of the channel La4, and the data stream a60 includes a channel identifier of the channel La6.

The sending device performs first interleaving by using an interleaving unit, where the first interleaving specifically includes: performing interleaving on the data stream a00 and the data stream a40, to obtain a data stream i0. When each data unit in the data stream a00 and the data stream a40 includes at least two bits, it may be considered that the first interleaving is performed according to a first data unit. When each data unit in the data stream a00 and the data stream a40 has only one bit, it may be considered that the first interleaving is performed according to a bit.

The sending device performs second interleaving by using the interleaving unit, where the second interleaving specifically includes: performing interleaving on the data stream a20 and the data stream a60, to obtain a data stream i1. When each data unit in the data stream a20 and the data stream a60 includes at least two bits, it may be considered that the second interleaving is performed according to a second data unit. When each data unit in the data stream a20 and the data stream a60 has only one bit, it may be considered that the second interleaving is performed according to a bit.

The interleaving unit performs third interleaving on the data stream i0 and the data stream i1, to obtain a data stream i2.

The data stream i2 is sent to the receiving device.

The third interleaving shown in FIG. 5 is a case in which the interleaving is performed by using each data unit as a basic unit, that is, the interleaving is performed according to a data unit, and each data unit may include one or more bits. When each data unit includes at least two bits, in a case in which the interleaving is performed according to a data unit, an arrangement order of bits in one data unit in one data stream before the interleaving shall not be changed due to the fact that the interleaving is performed. This is because one data unit is a basic unit of the interleaving.

Optionally, when each data unit obtained through the first interleaving includes multiple bits, for the third interleaving, the interleaving may also be performed according to a bit.

The sending device shown in FIG. 5 includes two FEC units; however, in an actual application, one sending device may include more FEC units, for example, one sending device may include four FEC units. When one sending device includes n FEC units, the sending device may perform the interleaving on n data streams that are from the n FEC units, where the n data streams are from different FEC units. For example, when the sending device includes four FEC units: the FECa0, the FECa1, an FECa2, and an FECa3, and the FECa0 outputs a data stream a0, the FECa1 outputs a data stream a1, the FECa2 outputs a data stream a2, and the FECa3 outputs a data stream a3, the sending device may perform the interleaving on the four data streams: the data streams a0 to a3.

Figure 6:
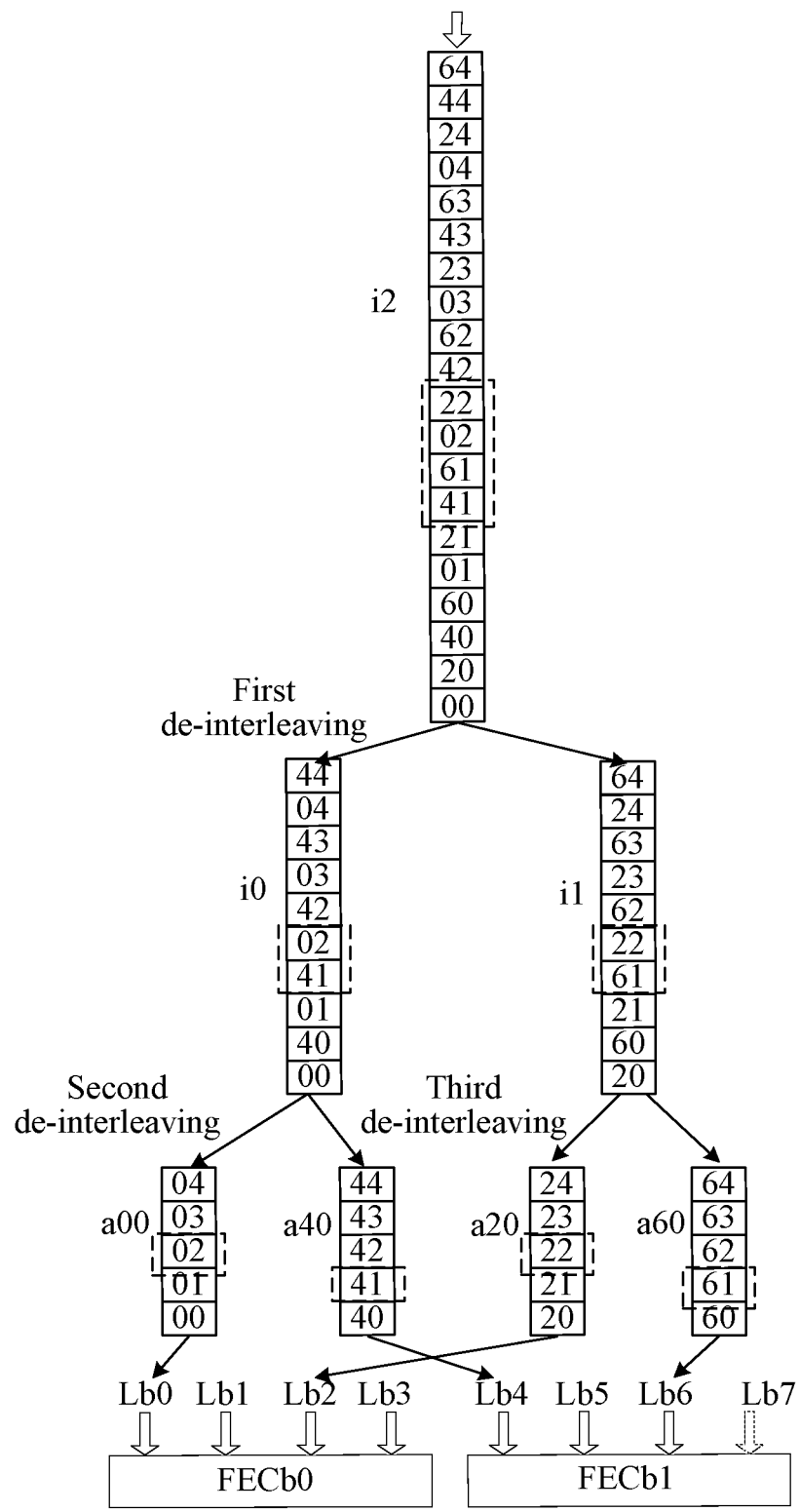
FIG. 6 is a schematic diagram of data receiving according to an embodiment of the present invention.

As shown in FIG. 6, after the receiving device receives the data stream i2, first de-interleaving is performed on the data stream i2 by using the de-interleaving unit, to obtain the data stream i0 and the data stream i1.

The receiving device then performs second de-interleaving on the data stream i0 by using the de-interleaving unit, and performs third de-interleaving on the data stream i1. The second de-interleaving specifically includes: performing the de-interleaving on the data stream i0, to obtain the data stream a00 and the data stream a40; and the third de-interleaving specifically includes: performing the de-interleaving on the data stream i1, to obtain the data stream a20 and the data stream a60.

When the data stream i0 is obtained after the sending device performs the interleaving according to the first data unit, the second de-interleaving refers to performing the de-interleaving according to the first data unit. When the data stream i1 is obtained after the sending device performs the interleaving according to the second data unit, the third de-interleaving refers to performing the de-interleaving according to the second data unit.

When the data stream i0 is obtained after the sending device performs the interleaving according to a bit, for the second de-interleaving, the de-interleaving is performed according to a bit. When the data stream i1 is obtained after the sending device performs the interleaving according to a bit, for the third de-interleaving, the de-interleaving is performed according to a bit.

The data stream a00 includes the channel identifier of the channel La0, the data stream a20 includes the channel identifier of the channel La2, the data stream a40 includes the channel identifier of the channel La4, and the data stream a60 includes the channel identifier of the channel La6. Therefore, the receiving device can obtain the foregoing four channel identifiers according to the foregoing four data streams that are obtained through the second de-interleaving and the third de-interleaving. Then, the corresponding channels in the receiving device are separately found according to the foregoing four channel identifiers. For example, it is determined, according to the channel identifier of the channel La0 and a correspondence 0, that a channel Lb0 is a channel corresponding to the channel La0, and is used to receive the data stream a00, where the correspondence 0 includes a correspondence between the channel identifier of the channel La0 and a channel identifier of the channel Lb0. According to the foregoing principle, the receiving device determines, according to the channel identifier of the channel La2 and a correspondence 2, that a channel Lb2 is a channel corresponding to the channel La2, and is used to receive the data stream a20; determines, according to the channel identifier of the channel La4 and a correspondence 4, that a channel Lb4 is a channel corresponding to the channel La4, and is used to receive the data stream a40; and determines, according to the channel identifier of the channel La6 and a correspondence 6, that a channel Lb6 is a channel corresponding to the channel La6, and is used to receive the data stream a60.

After that, the receiving device sends, to an FECb0 by using the channel Lb0, the data stream a00 that is obtained according to the data stream i0, for FEC decoding, and sends, to an FECb1 by using the channel Lb4, the data stream a40 that is obtained according to the data stream i0, for FEC decoding; and sends, to the FECb0 by using the channel Lb2, the data stream a20 that is obtained according to the data stream i1, for FEC decoding, and sends, to the FECb1 by using the channel Lb6, the data stream a60 that is obtained according to the data stream i1, for FEC decoding.

An error may occur during a transmission process of the data stream i2 from the sending device to the receiving device. For example, when an error occurs in the data units 41, 61, 02, and 22 in the data stream i2, after the first de-interleaving, the data unit 41 and the data unit 02 are allocated to the data stream i0, and the data unit 61 and the data unit 22 are allocated to the data stream i1. After the second de-interleaving and the third de-interleaving, the data unit 02 is allocated to the data stream a00, the data unit 41 is allocated to the data stream a40, the data unit 21 is allocated to the data stream a20, and the data unit 61 is allocated to the data stream a60. In this way, the four data units in which the error occurs are allocated to different FEC units for FEC decoding. In this way, a probability that a large number of bit errors are allocated to a same FEC unit decreases and error correction capabilities of multiple FEC units in the receiving device can be fully utilized. Therefore, a probability that the receiving device successfully corrects bit errors increases on a whole.

Referring to FIG. 11, an embodiment of the present invention provides a method for performing interleaving. The method is performed by a sending device, the sending device includes four forward error correction FEC units, which are an FEC0, an FEC1, an FEC2, and an FEC3, and each FEC unit outputs four data streams. As shown in FIG. 11, the FEC0 includes four channels, that is, a Lane0 to a Lane3, and each channel outputs one data stream; and therefore the Lane0 to the Lane3 output data streams L0 to L3. Four channels Lane4 to Lane7 of the FEC1 output data streams L4 to L7, four channels Lane8 to Lane11 of the FEC2 output data streams L8 to L11, and four channels Lane12 to Lane15 of the FEC3 output data streams L12 to L15. Each data stream includes a channel identifier of a channel corresponding to the data stream, for example, the L0 includes an identifier of the Lane0. A specific manner for carrying a channel identifier may be that multiple packets or each packet in one data stream includes a channel identifier of a channel through which the data stream is sent.

The L0 to the L15 correspondingly output symbol (English: Symbol) data streams. For example, bits 000.0 to 000.9 on the Lane0 represent one Symbol; and bits 004.0 and 004.1 represent the first two bits of a next Symbol, and subsequent bits are not shown. Such a data stream that includes multiple Symbols is a symbol data stream. Similarly, data streams on the Lane1 to the Lane15 are also symbol data streams.

Before interleaving, 000.0 to 000.9 in the FEC0 represent ten bits of a Symbol00, 001.0 to 001.9 represents ten bits of a Symbol01, 002.0 to 002.9 represent ten bits of a Symbol02, and 003.0 to 003.9 represent ten bits of a Symbol03. Structures of data streams output by the FEC1, the FEC2, and the FEC3 are the same as a structure of a data stream output by the FEC0, and the data streams are all symbol data streams, and each symbol includes ten bits. In addition, an order in which a bit in each Symbol is output is relevant to a sequence number of this bit, for example, 000.0 is output first, then 000.1 is output, then 000.2 is output after 000.1, and so on. It may be understood that in one Symbol, a bit whose sequence number is smaller is output earlier than a bit whose sequence number is greater. Data in L1 is used as an example: 000.0 is less than 000.1, and therefore 000.0 is output earlier than 000.1; and 000.9 is less than 004.0, and therefore 000.9 is output earlier than 004.0. In another data stream, a principle of determining an output order is the same as the foregoing.

Next, a specific manner of the interleaving is introduced according to FIG. 11.

The first beat of data of four data streams of the FEC0, that is, 000.0, 001.0, 002.0, and 003.0, is used as the first beat of data of four interleaved streams EL0 to EL3 that are obtained after the interleaving has been performed, where the interleaved streams are data streams obtained after the interleaving has been performed; the first beat of data of four streams of the FEC1, that is, 100.0, 101.0, 102.0, and 103.0, is used as the second beat of data of the EL0 to the EL3; the first beat of data of four streams of the FEC2, that is, 200.0, 201.0, 202.0, and 203.0, is used as the third beat of data of the EL0 to the EL3; and the first beat of data of four streams of the FEC3, that is, 300.0, 301.0, 302.0, and 303.0, is used as the fourth beat of data of the EL0 to the EL3.

The second beat of data of four data streams of the FEC0, that is, 000.1, 001.1, 002.1, and 003.1, is used as the first beat of data of four interleaved streams EL4 to EL7 that are obtained after the interleaving has been performed; the second beat of data of four data streams of the FEC1, that is, 100.1, 101.1, 102.1, and 103.1, is used as the second beat of data of the EL4 to the EL7; the second beat of data of four streams of the FEC2, that is, 200.1, 201.1, 202.1, and 203.1, is used as the third beat of data of the EL4 to the EL7; and the second beat of data of the FEC3, that is, 300.1, 301.1, 302.1, and 303.1, are used as the fourth beat of data of the EL4 to the EL7.

The third beat of data of four data streams of the FEC0, that is, 000.2, 001.2, 002.2, and 003.2, is used as the first beat of data of four interleaved streams EL8 to EL11 that are obtained after the interleaving has been performed; the third beat of data of four data streams of the FEC1, that is, 100.2, 101.2, 102.2, and 103.2, is used as the second beat of data of the EL8 to the EL11; the third beat of data of four data streams of the FEC2, that is, 200.2, 201.2, 202.2, and 203.2, is used as the third beat of data of the EL8 to the EL11; and the third beat of data of four data streams of the FEC3, that is, 300.2, 301.2, 302.2, and 303.2, is used as the fourth beat of data of the EL8 to the EL11.

The fourth beat of data of four data streams of the FEC0: 000.3, 001.3, 002.3, and 003.3, is used as the first beat of data of four interleaved streams EL12 to EL15 that are obtained after the interleaving has been performed; the fourth beat of data of four data streams of the FEC1, that is, 100.3, 101.3, 102.3, and 103.3, is used as the second beat of data of the EL12 to the EL15; the fourth beat of data of four data streams of the FEC2, that is, 200.3, 201.3, 202.3, and 203.3, is used as the third beat of data of the EL12 to the EL15; and the fourth beat of data of four data streams of the FEC3, that is, 300.3, 301.3, 302.3, and 303.3, is used as the fourth beat of data of the EL12 to the EL15.

By analogy, subsequent data after the interleaving continues to be obtained.

For example, the fifth beat of data of four data streams of the FEC0 is used as the fifth beat of data of the EL4 to the EL7; the fifth beat of data of four data streams of the FEC1 is used as the sixth beat of data of the EL4 to the EL7; the fifth beat of data of four data streams of the FEC2 is used as the seventh beat of data of the EL4 to the EL7; and the fifth beat of data of four data streams of the FEC3 are used as the eighth beat of data of the EL4 to the EL7. In addition, each bit in this embodiment may be replaced with another data unit, for example, a bit is replaced with a byte (byte), and then 000.0 indicates one byte.

After the interleaving has been performed, 16 interleaved streams are obtained, that is, the EL0 to the EL15. Each stream in the 16 interleaved data streams is orthogonal, that is, on each interleaved stream, adjacent bits all come from different FEC units. For example, in the EL0, four bits, which are 000.0, 100.0, 200.0, and 300.0, come from four different FEC units, which reflects an orthogonal feature. In this way, when a string of bit errors occur on one interleaved stream, after being de-interleaved at a receive end, the bit errors are allocated to the four FEC units for error correction. In this way, a quantity of bit errors that each FEC unit needs to process is much less than a quantity of the string of bit errors.

Referring to FIG. 12, an embodiment of the present invention provides a method for performing interleaving. In FIG. 12, to-be-interleaved data streams output by an FEC0, an FEC1, an FEC2, and an FEC3 in a sending device are the same as the to-be-interleaved data streams shown in FIG. 11. In this embodiment, one symbol includes ten data units, for example, one Symbol includes ten data units, which are 000.0, 000.1, . . . , and 000.9, and 100.0, 100.1, . . . , and 100.9 belong to another Symbol.

Certainly, a quantity of data units included in one Symbol may vary, and is not necessarily 10.

Next, a specific manner of the interleaving in this embodiment is introduced according to FIG. 12.

In FIG. 12, four interleaved streams obtained by means of the interleaving, which are EL0 to EL3, are obtained in the following manner:

the first beat of data of the EL0 to the EL3, that is, 000.0, 000.1, 000.2, and 000.3, comes from the $1^{th}$ to the $4^{th}$ data units in a Lane0;

the second beat of data of the EL0 to the EL3, that is, 100.0, 100.1, 100.2, and 100.3, comes from the $1^{th}$ to the $4^{th}$ data units in a Lane4;

the third beat of data of the EL0 to the EL3, that is, 200.0, 200.1, 200.2, and 200.3, comes from the $1^{th}$ to the $4^{th}$ data units in a Lane8;

the fourth beat of data of the EL0 to the EL3, that is, 300.0, 300.1, 300.2, and 300.3, comes from the $1^{th}$ to the $4^{th}$ data units in a Lane12;

the fifth beat of data of the EL0 to the EL3, that is, 000.4, 000.5, 000.6, and 000.7, comes from the $5^{th}$ to the $8^{th}$ data units in the Lane0;

the sixth beat of data of the EL0 to the EL3, that is, 100.4, 100.5, 100.6, and 100.7, comes from the $5^{th}$ to the $8^{th}$ data units in the Lane4;

the seventh beat of data of the EL0 to the EL3, that is, 200.4, 200.5, 200.6, and 200.7, comes from the $5^{th}$ to the $8^{th}$ data units in the Lane8;

the eighth beat of data of the EL0 to the EL3, that is, 300.4, 300.5, 300.6, and 300.7, comes from the $5^{th}$ to the $8^{th}$ data units in the Lane12;

the ninth beat of data of the EL0 to the EL3, that is, 000.8, 000.9, 004.0, and 004.1, comes from the $9^{th}$ to the $12^{th}$ data units in the Lane0;

the tenth beat of data of the EL0 to the EL3, that is, 100.8, 100.9, 104.0, and 104.1, comes from the $9^{th}$ to the $12^{th}$ data units in the Lane4;

the eleventh beat of data of the EL0 to the EL3, that is, 200.8, 200.9, 204.0, and 204.1, comes from the $9^{th}$ to the $12^{th}$ data units in the Lane8; and the twelfth beat of data of the EL0 to the EL3, that is, 300.8, 300.9, 304.0, and 304.1, comes from the $9^{th}$ to the $12^{th}$ data units in the Lane12.

000.8 and 000.9 in the ninth beat of data of the EL0 to the EL3 and eight data units, which are 000.0, and 000.1 to 000.7, belong to one Symbol, and data units 004.0 and 004.1 belong to another Symbol. It is also similar for the data in the tenth beat to the twelfth beat of the EL0 to the EL3.

12 interleaved streams, which are EL4 to EL7, EL8 to EL11, and EL12 to EL15, are also obtained by using the foregoing method.

Four interleaved streams, which are the EL4 to the EL7, are obtained by means of interleaving in the following manner:

the first beat of data of the EL4 to the EL7, that is, 001.0, 001.1, 001.2, and 001.3, comes from the $1^{th}$ to the $4^{th}$ data units in a Lane1;

the second beat of data of the EL4 to the EL7, that is, 101.0, 101.1, 101.2, and 101.3, comes from the $1^{th}$ to the $4^{th}$ data units in a Lane5;

the third beat of data of the EL4 to the EL7, that is, 201.0, 201.1, 201.2, and 201.3, comes from the $1^{th}$ to the $4^{th}$ data units in a Lane9;

the fourth beat of data of the EL4 to the EL7, that is, 301.0, 301.1, 301.2, and 301.3, comes from the $1^{th}$ to the $4^{th}$ data units in a Lane13;

the fifth beat of data of the EL4 to the EL7, that is, 001.4, 001.5, 001.6, and 001.7, comes from the $5^{th}$ to the $8^{th}$ data units in the Lane1;

the sixth beat of data of the EL4 to the EL7, that is, 101.4, 101.5, 101.6, and 101.7, comes from the $5^{th}$ to the $8^{th}$ data units in the Lane5;

the seventh beat of data of the EL4 to the EL7, that is, 201.4, 201.5, 201.6, and 201.7, comes from the $5^{th}$ to the $8^{th}$ data units in the Lane9;

the eighth beat of data of the EL4 to the EL7, that is, 301.4, 301.5, 301.6, and 301.7, comes from the $5^{th}$ to the $8^{th}$ data units in the Lane13;

the ninth beat of data of the EL4 to the EL7, that is, 001.8, 001.9, 005.0, and 005.1, comes from the $9^{th}$ to the $12^{th}$ data units in the Lane1;

the tenth beat of data of the EL4 to the EL7, that is, 101.8, 101.9, 105.0, and 105.1, comes from the $9^{th}$ to the $12^{th}$ data units in the Lane5;

the eleventh beat of data of the EL4 to the EL7, that is, 201.8, 201.9, 205.0, and 205.1, comes from the $9^{th}$ to the $12^{th}$ data units in the Lane9; and the twelfth beat of data of the EL4 to the EL7, that is, 301.8, 301.9, 305.0, and 305.1, comes from the $9^{th}$ to the $12^{th}$ data units in the Lane13.

Four interleaved streams, which are the EL8 to the EL11, are obtained by means of interleaving in the following manner:

the first beat of data of the EL8 to the EL11, that is, 002.0, 002.1, 002.2, and 002.3, comes from the $1^{th}$ to the $4^{th}$ data units in a Lane2;

the second beat of data of the EL8 to the EL11, that is, 102.0, 102.1, 102.2, and 102.3, comes from the $1^{th}$ to the $4^{th}$ data units in a Lane6;

the third beat of data of the EL8 to the EL11, that is, 202.0, 202.1, 202.2, and 202.3, comes from the $1^{th}$ to the $4^{th}$ data units in a Lane10;

the fourth beat of data of the EL8 to the EL11, that is, 302.0, 302.1, 302.2, and 302.3, comes from the $1^{th}$ to the $4^{th}$ data units in a Lane14;

the fifth beat of data of the EL8 to the EL11, that is, 002.4, 002.5, 002.6, and 002.7, comes from the $5^{th}$ to the $8^{th}$ data units in the Lane2;

the sixth beat of data of the EL8 to the EL11, that is, 102.4, 102.5, 102.6, and 102.7, comes from the $5^{th}$ to the $8^{th}$ data units in the Lane6;

the seventh beat of data of the EL8 to the EL11, that is, 202.4, 202.5, 202.6, and 202.7, comes from the $5^{th}$ to the $8^{th}$ data units in a Lane10;

the eighth beat of data of the EL8 to the EL11, that is, 302.4, 302.5, 302.6, and 302.7, comes from the $5^{th}$ to the $8^{th}$ data units in the Lane14;

the ninth beat of data of the EL8 to the EL11, that is, 002.8, 002.9, 006.0, and 006.1, comes from the $9^{th}$ to the $12^{th}$ data units in the Lane2;

the tenth beat of data of the EL8 to the EL11, that is, 102.8, 102.9, 106.0, and 106.1, comes from the $9^{th}$ to the $12^{th}$ data units in the Lane6;

the eleventh beat of data of the EL8 to the EL11, that is, 202.8, 202.9, 206.0, and 206.1, comes from the $9^{th}$ to the $12^{th}$ data units in the Lane10; and the twelfth beat of data of the EL8 to the EL11, that is, 302.8, 302.9, 306.0, and 306.1, comes from the $9^{th}$ to the $12^{th}$ data units in the Lane14;

Four interleaved streams, which are the EL12 to the EL15, are obtained by means of interleaving in the following manner:

the first beat of data of the EL12 to the EL15, that is, 003.0, 003.1, 003.2, and 003.3, comes from the $1^{th}$ to the $4^{th}$ data units in a Lane3;

the second beat of data of the EL12 to the EL15, that is, 103.0, 103.1, 103.2, and 103.3, comes from the $1^{th}$ to the $4^{th}$ data units in a Lane7;

the third beat of data of the EL12 to the EL15, that is, 203.0, 203.1, 203.2, and 203.3, comes from the $1^{th}$ to the $4^{th}$ data units in a Lane11;

the fourth beat of data of the EL12 to the EL15, that is, 303.0, 303.1, 303.2, and 303.3, comes from the $1^{th}$ to the $4^{th}$ data units in a Lane15;

the fifth beat of data of the EL12 to the EL15, that is, 003.4, 003.5, 003.6, and 003.7, comes from the $5^{th}$ to the $8^{th}$ data units in the Lane3;

the sixth beat of data of the EL12 to the EL15, that is, 103.4, 103.5, 103.6, and 103.7, comes from the $5^{th}$ to the $8^{th}$ data units in the Lane7;

the seventh beat of data of the EL12 to the EL15, that is, 203.4, 203.5, 203.6, and 203.7, comes from the $5^{th}$ to the $8^{th}$ data units in the Lane11;

the eighth beat of data of the EL12 to the EL15, that is, 303.4, 303.5, 303.6, and 303.7, comes from the $5^{th}$ to the $8^{th}$ data units in the Lane15;

the ninth beat of data of the EL12 to the EL15, that is, 003.8, 003.9, 007.0, and 007.1, comes from the $9^{th}$ to the $12^{th}$ data units in the Lane3;

the tenth beat of data of the EL12 to the EL15, that is, 103.8, 103.9, 107.0, and 107.1, comes from the $9^{th}$ to the $12^{th}$ data units in the Lane7;

the eleventh beat of data of the EL12 to the EL15, that is, 203.8, 203.9, 207.0, and 207.1, comes from the $9^{th}$ to the $12^{th}$ data units in the Lane11; and the twelfth beat of data of the EL12 to the EL15, that is, 303.8, 303.9, 307.0, and 307.1, comes from the $9^{th}$ to the $12^{th}$ data units in the Lane15.

In this embodiment, each data unit may be one bit, or may be one byte, or may be with another data length.

Figure 13:
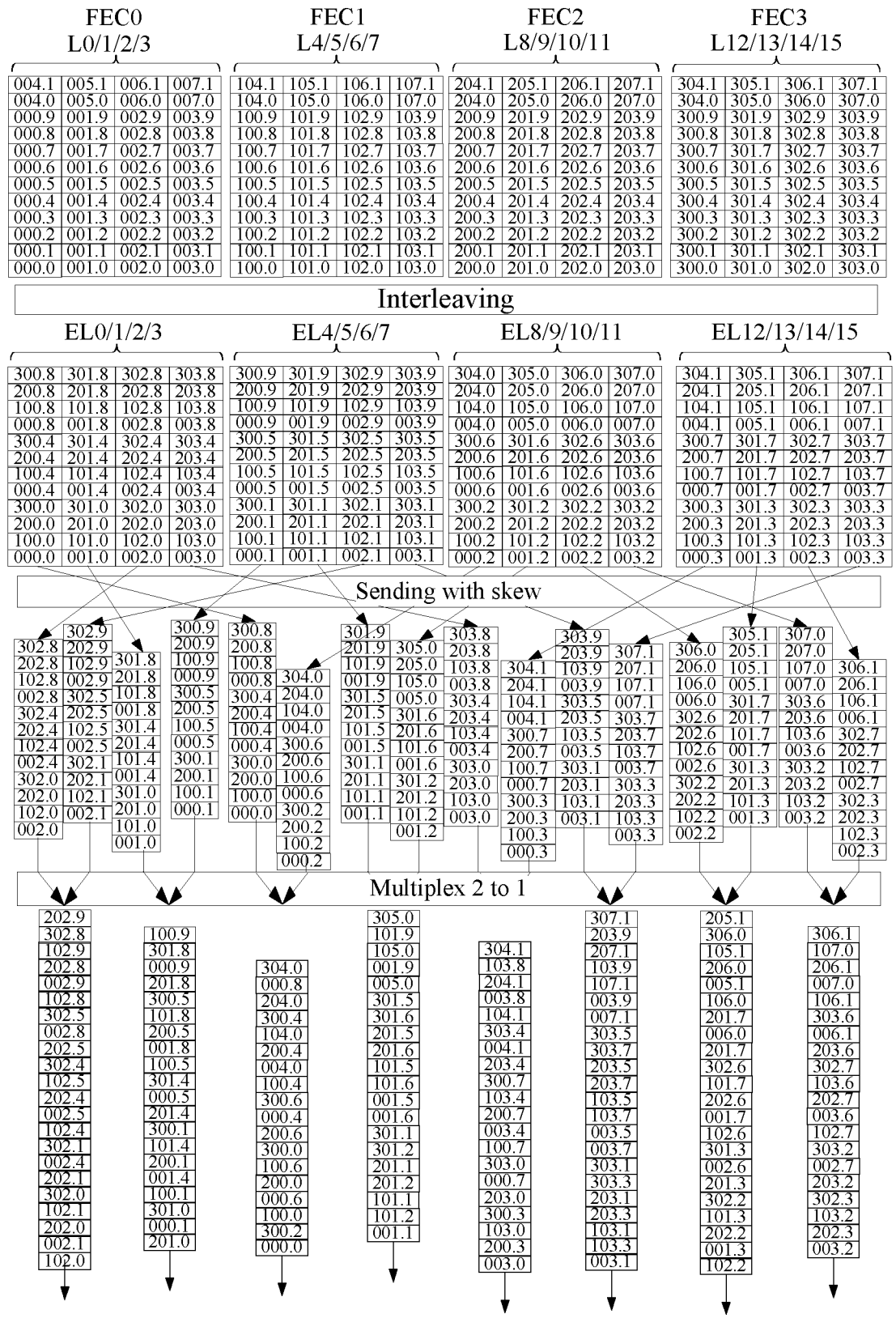
FIG. 13 is a schematic diagram of performing further interleaving based on a result of the interleaving shown in FIG. 11 according to an embodiment of the present invention.

FIG. 13 shows a case in which further interleaving is performed on the EL1 to the EL15 that are obtained after the interleaving shown in FIG. 11. As shown in FIG. 13, before the further interleaving is performed, during transmission, skew (English: skew) may occur in the ELs, that is, delays are generated. However, this does not affect the execution of the further interleaving. FIG. 13 clearly shows the interleaving is performed between which ELs, for example, the interleaving is performed between the EL2 and the EL6, and the interleaving is performed between the EL1 and the EL4. The interleaving may be performed between any two or more ELs, no matter whether the ELs come from a same FEC or different FECs.

Figure 14:
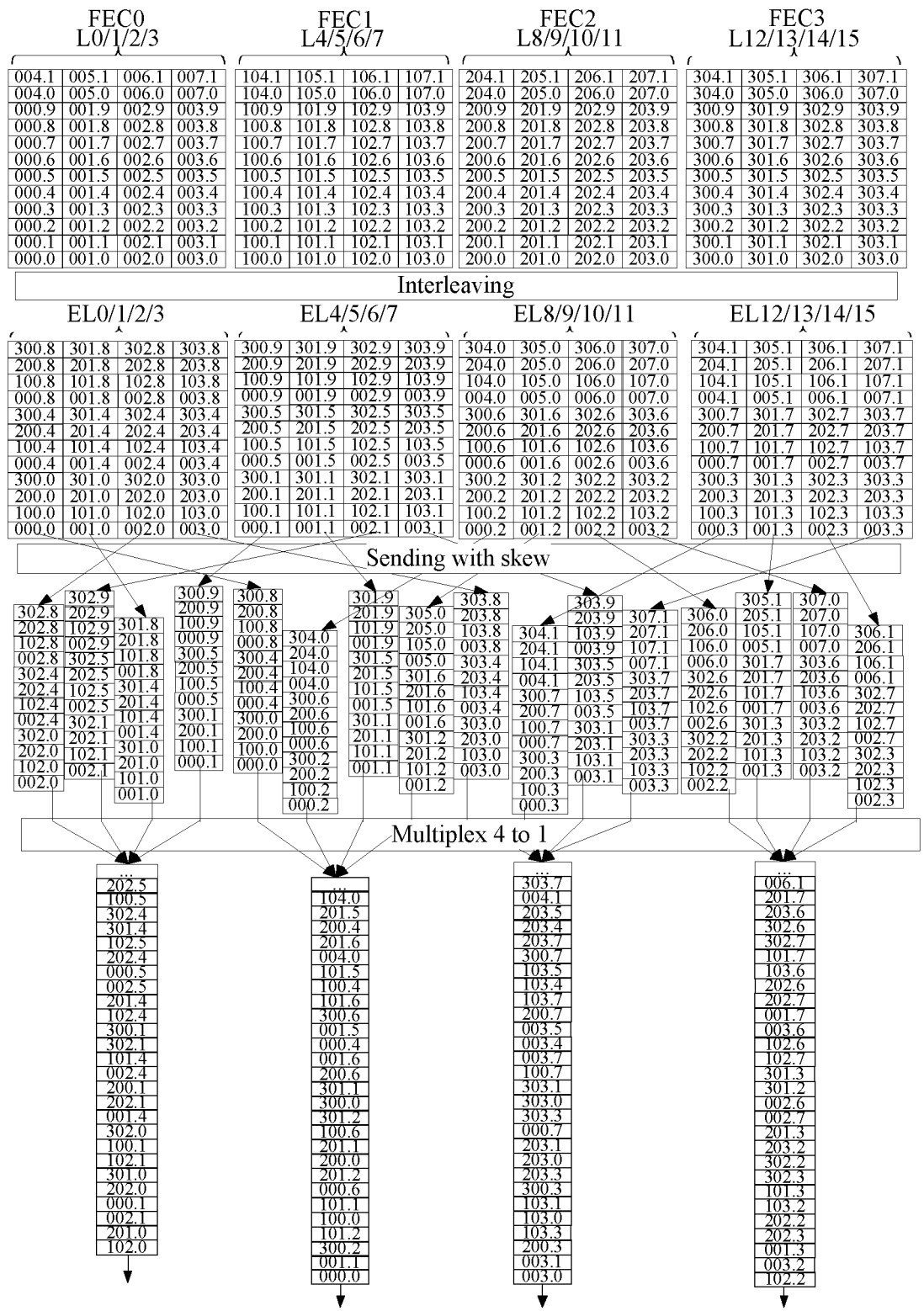
FIG. 14 is a schematic diagram of performing another type of further interleaving based on a result of the interleaving shown in FIG. 11 according to an embodiment of the present invention.

FIG. 14 shows a case in which another type of further interleaving is performed on the EL1 to the EL15 that are obtained after the interleaving shown in FIG. 11. As shown in FIG. 14, before the further interleaving is performed, during transmission, skew (English: skew) may occur in the ELs, that is, delays are generated. However, this does not affect the execution of the another type of further interleaving. FIG. 14 clearly shows the interleaving is performed between which ELs, for example, the interleaving is performed between the EL2, the EL6, the EL1, and the EL4. The interleaving may be performed between any four ELs, no matter whether the ELs come from a same FEC or different FECs.

When the further interleaving is performed, a quantity of ELs is not limited to 2 or 4, and the quantity may be any value that is greater than or equal to 2.

Figure 15:
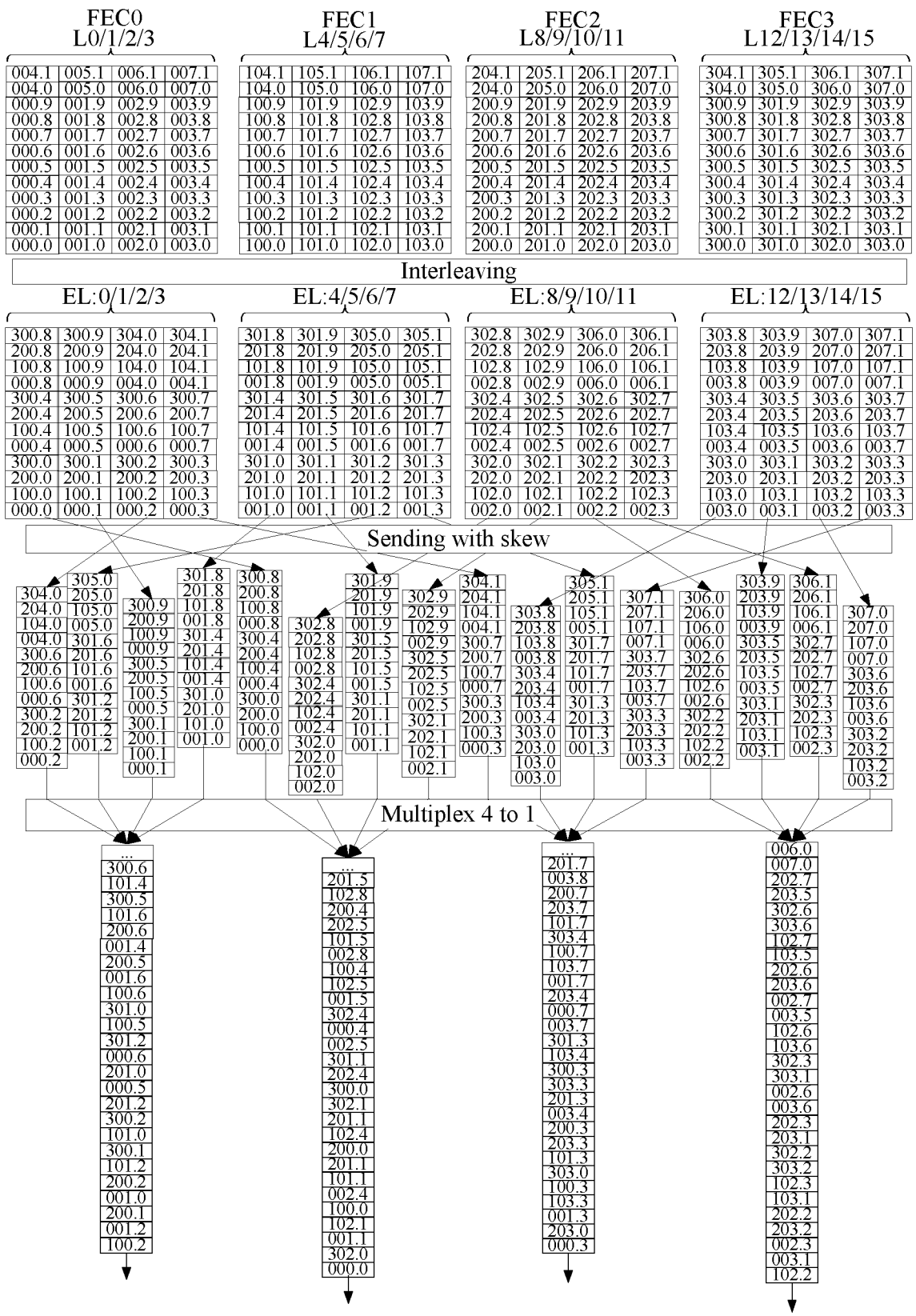
FIG. 15 is a schematic diagram of continuing to perform interleaving based on a result of the interleaving shown in FIG. 12 according to an embodiment of the present invention.

The foregoing methods for performing the further interleaving and the another type of further interleaving are not only applicable to the data streams obtained by means of the interleaving shown in FIG. 11, but also applicable to the data streams obtained by means of the interleaving shown in FIG. 12. FIG. 15 shows a case in which interleaving continues to be performed on the data streams obtained by means of the interleaving shown in FIG. 12.

An embodiment of the present invention includes a process during which a sending device sends data to a receiving device, and the receiving device performs corresponding receiving.

Figure 7:
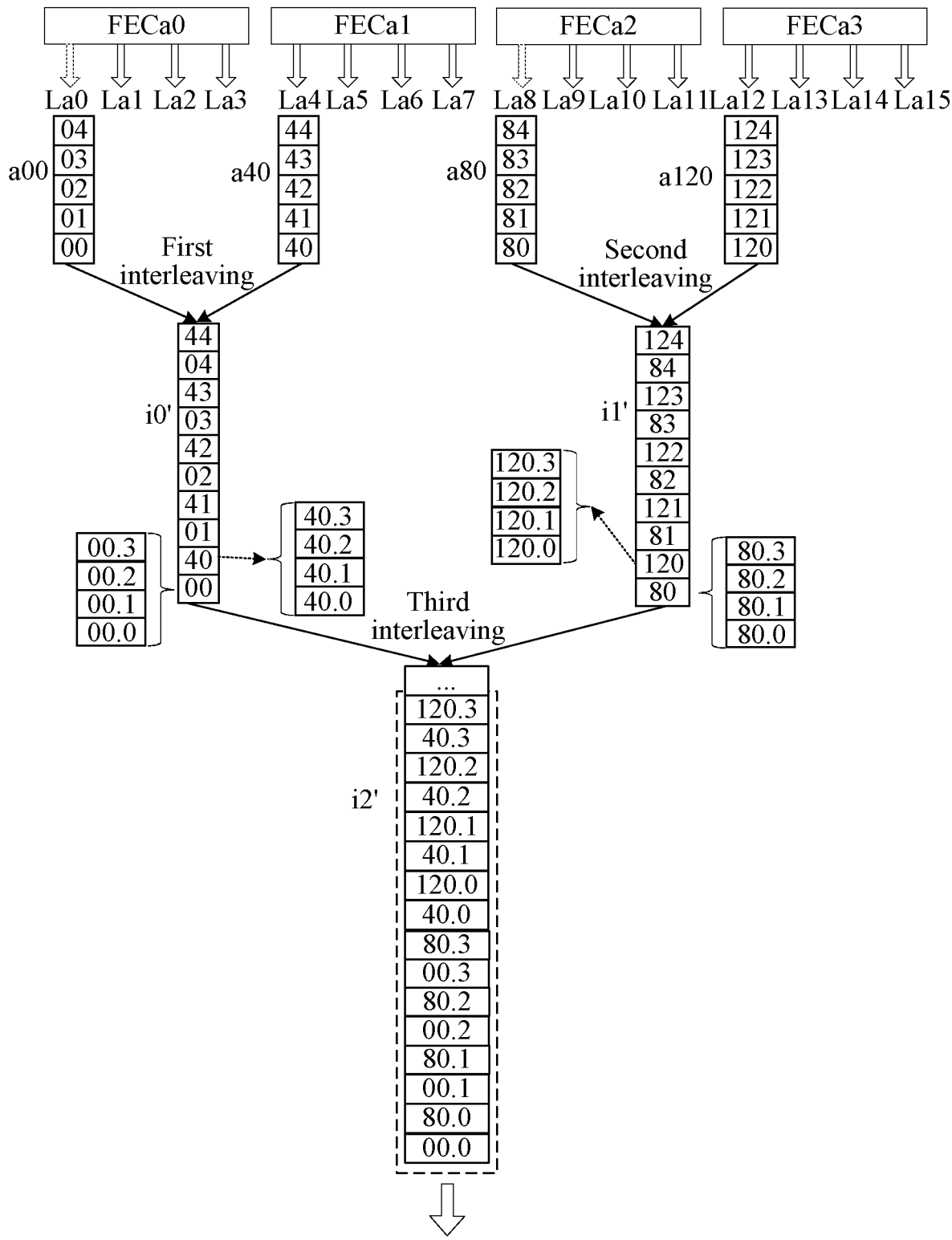
FIG. 7 is a schematic diagram of data sending according to an embodiment of the present invention.

As shown in FIG. 7, the sending device includes four FEC units, which are an FECa0, an FECa1, an FECa2, and an FECa3, respectively. In FIG. 7, the FECa0 includes channels La0 to La3, the FECa1 includes channels La4 to La7, the FECa2 includes channels La8 to La11, and the FECa3 includes channels La12 to La15. The four channels La0 to La3 are used to output a data stream encoded by the FECa0, the four channels La4 to La7 are used to output a data stream encoded by the FECa1, the four channels La8 to La11 are used to output a data stream encoded by the FECa2, and the four channels La12 to La15 are used to output a data stream encoded by the FECa3.

As shown in FIG. 7, the channel La0 outputs a data stream a00, the channel La4 outputs a data stream a40, the channel La8 outputs a data stream a80, and the channel La12 outputs a data stream a120. The data stream a00 includes five data units: data units 00 to 04 that are arranged in order, the data stream a40 includes five data units: data units 40 to 44 that are arranged in order, the data stream a80 includes five data units: data units 80 to 84 that are arranged in order, and the data stream a120 includes five data units: data units 120 to 124 that are arranged in order. The data stream a00 includes a channel identifier of the channel La0, the data stream a40 includes a channel identifier of the channel La4, the data stream a80 includes a channel identifier of the channel La8, and the data stream a120 includes a channel identifier of the channel La12.

The sending device performs first interleaving and second interleaving by using an interleaving unit. For the first interleaving, the interleaving is performed according to a first data unit, and for the second interleaving, the interleaving is performed according to a second data unit, where the first data unit includes at least two bits, and the second data unit includes at least two bits. The number of bits included in the first data unit and the number of bits included in the second data unit may be the same or different.

Performing interleaving according to a data unit refers to dividing, according to a length of the data unit, each of at least two to-be-interleaved data streams into data blocks, and then performing the interleaving on the obtained data blocks, where the length of the data unit refers to the number of bits included in the data unit.

The first interleaving specifically includes: performing the interleaving on the data stream a00 and the data stream a40, to obtain a data stream i0'; and the second interleaving includes performing the interleaving on the data stream a80 and the data stream a120, to obtain a data stream i1'.

In FIG. 7, an example in which each data unit in each data stream includes four bits is used for description. As shown in FIG. 7, in the data stream i0', the data unit 00 includes four bits: 00.0, 00.1, 00.2, and 00.3, and the data unit 40 includes four bits: 40.0, 40.1, 40.2, and 40.3; and the data unit 80 in the data stream i1' includes four bits: 80.0, 80.1, 80.2, and 80.3, and the data unit 120 in the data stream i1' includes four bits: 120.0, 120.1, 120.2, and 120.3. It should be noted that, in an actual application, the number of bits included in each data unit may also be another value not less than two, for example, each data unit includes 10 bits.

It can be seen from FIG. 7 that, the numbers of bits included in the first data unit and the number of bits included in the second data unit are both four.

The interleaving unit performs third interleaving on the data stream i0' and the data stream i1', to obtain a data stream i2', where for the third interleaving, the interleaving is performed according to a bit. The interleaving is performed according to a bit; therefore, in the data stream i2', the four bits: bits 00.0, 00.1, 00.2, and 00.3 are not consecutive any longer, but are mutually interleaved with the four bits in the data unit 80.

In the third interleaving shown in FIG. 7, there is no skew (English: skew) between the data stream i0' and the data stream i1', that is, the interleaving is performed on the data stream i0' and the data stream i1' in a case in which the data stream i0' and the data stream i1' are aligned. Optionally, the interleaving may be performed on the data stream i0' and the data stream i1' in a case in which there is a skew between the data stream i0' and the data stream i1'. For example, when the skew is two bits, an arrangement order of the multiple bits in the data stream i2' is 00.2-80.0-00.3-80.1-40.0-80.2-40.1-80.3-40.2-120.0-40.3, . . . .

Figure 8:
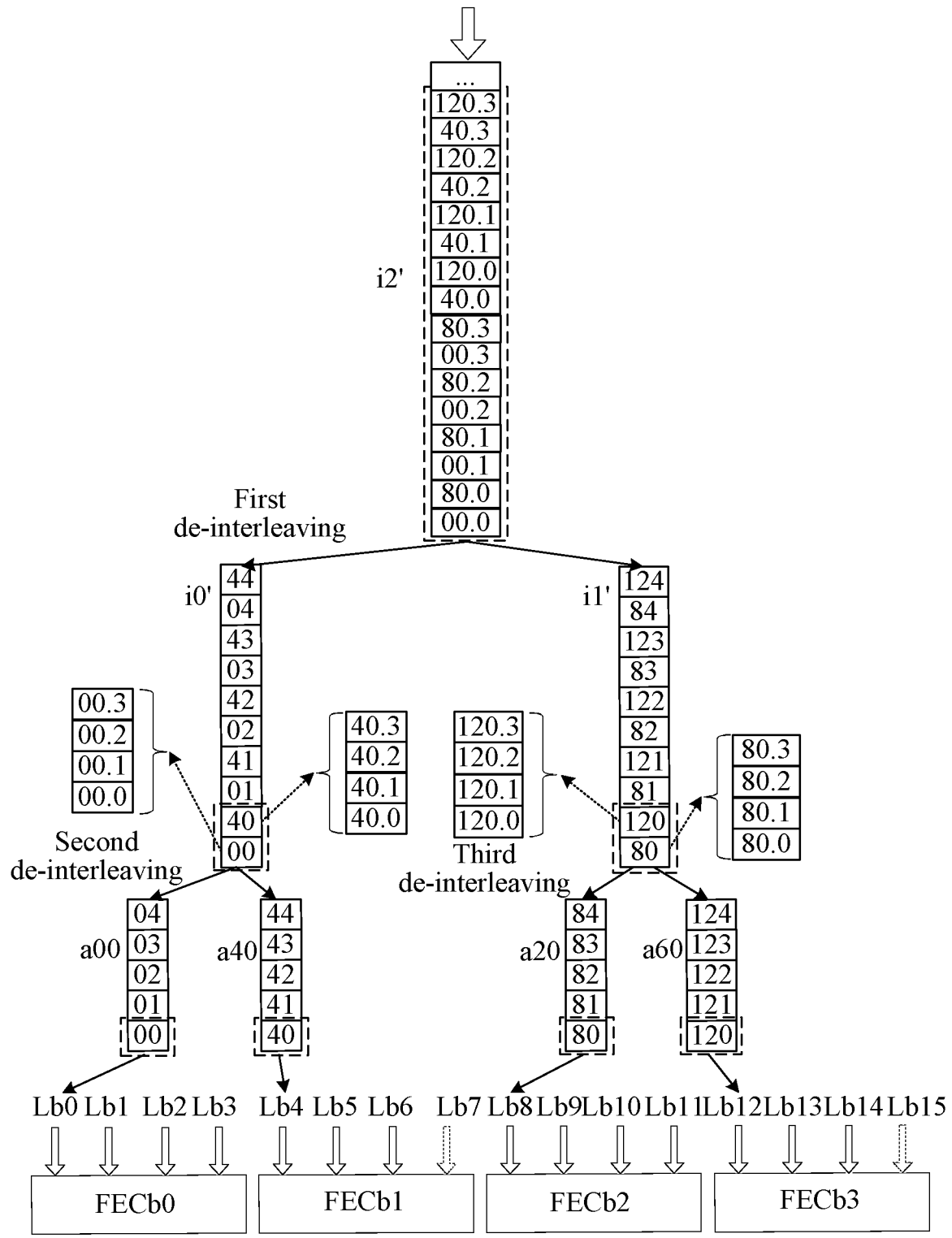
FIG. 8 is a schematic diagram of data receiving according to an embodiment of the present invention.

As shown in FIG. 8, after the receiving device receives the data stream i2', first de-interleaving is performed on the data stream i2 by using a de-interleaving unit, to obtain the data stream i0' and the data stream i1', where for the first de-interleaving, the de-interleaving is performed according to a bit. For the third interleaving, the interleaving is performed according to a bit. Therefore, for the corresponding first de-interleaving, the de-interleaving also needs to be performed according to a bit.

The receiving device then performs second de-interleaving on the data stream i0' by using the de-interleaving unit, and performs third de-interleaving on the data stream i1'. The second de-interleaving specifically includes: performing the de-interleaving on the data stream i0' according to the first data unit, to obtain the data stream a00 and the data stream a40; and the third de-interleaving specifically includes: performing the de-interleaving on the data stream i1' according to the second data unit, to obtain the data stream a80 and the data stream a120.

Performing the de-interleaving according to a data unit is an inverse process of performing the interleaving according to a data unit. Therefore, the performing the de-interleaving according to the first data unit is an inverse process of the performing the interleaving according to the first data unit, and the performing the de-interleaving according to the second data unit is an inverse process of the performing the interleaving according to the second data unit.

After that, according to the method in the embodiment corresponding to FIG. 6, the receiving device sends the data stream a00 to the FECb0 in the receiving device, sends the data stream a40 to the FECb1 in the receiving device, sends the data stream a80 to an FECb2 in the receiving device, and sends the data stream a120 to an FECb3 in the receiving device.

Figure 9:
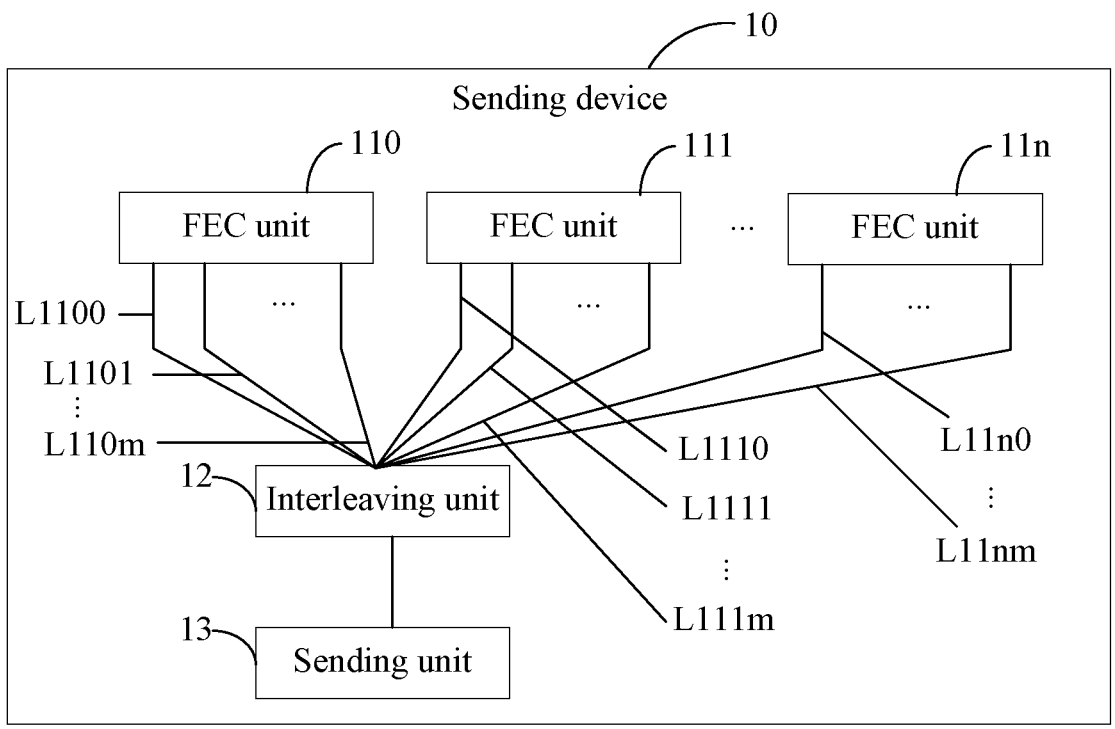
FIG. 9 is a schematic diagram of a sending device according to an embodiment of the present invention.

As shown in FIG. 9, an embodiment of the present invention provides a sending device 10, where the sending device 10 includes at least two FEC units, for example, the sending device 10 may include an FEC unit 110 and an FEC unit 111, and may further include one or more other FEC units. Each FEC unit may be connected to one or at least two channels. Each FEC unit is connected to an interleaving unit 12 by using a channel connected to the FEC unit. For example, as shown in FIG. 9, the FEC unit 110 is connected to the interleaving unit 12 by using m+1 channels from a channel L1100 to a channel L110m. Similarly, the FEC unit 111 is connected to the interleaving unit 12 by using m+1 channels from a channel L1110 to a channel L111m; and an FEC unit 1 1n is connected to the interleaving unit 12 by using m+1 channels from a channel L11n0 to a channel L11nm. It should be noted that, the number of the FEC units in the sending device 10 may vary, and is acceptable as long as the number is not less than two. For example, in the sending device 10, there may be only two FEC units or more FEC units.

The FEC unit 110 is configured to send, by using the channel L1100, a data stream s1100 on which first FEC encoding has been performed, where the data stream s1100 includes a channel identifier of the channel L1100; and the FEC unit 111 is configured to send, by using the channel L1110, a data stream s1100 on which second FEC encoding has been performed, where the data stream s1100 includes a channel identifier of the channel L1110, and an encoding rule of the first FEC encoding and that of the second FEC encoding are the same or different.

The interleaving unit 12 is configured to perform interleaving on the data stream s1100 and the data stream s 1110 that are received, to obtain an output data stream.

The output data stream obtained through the interleaving may be one data stream or may include at least two data streams. For example, when the interleaving unit 12 performs the interleaving in the manner shown in FIG. 1, the output data stream includes one data stream; and when the interleaving unit 12 performs the interleaving in the manner shown in FIG. 2, the output data stream includes two data streams that are independent of each other.

The sending device 10 further includes a sending unit 13, configured to send the output data stream to a receiving device.

Optionally, the FEC unit 110 is further configured to send, by using a channel L1101, a data stream s1101 on which third FEC encoding has been performed, where the data stream s1101 includes a channel identifier of the channel L1101, and an encoding rule of the third FEC encoding and that of the first FEC encoding are the same or different; and the FEC unit 111 is further configured to send, by using a channel L1111, a data stream s1111 on which fourth FEC encoding has been performed, where the data stream s1111 includes a channel identifier of the channel L1111, and an encoding rule of the fourth FEC encoding and that of the second FEC encoding are the same or different.

When the FEC unit 110 sends the data stream s1100 and the data stream s1101, and the FEC unit 111 sends the data stream s1110 and the data stream s1111, the interleaving unit 12 is specifically configured to:

perform first interleaving on the data stream s1100 and the data stream s1110;

perform second interleaving on the data stream s1101 and the data stream s1111; and perform third interleaving on a data stream that is obtained by performing the first interleaving and a data stream that is obtained by performing the second interleaving, to obtain the output data stream.

Preferably, for the first interleaving, the interleaving is performed according to a first data unit, for the second interleaving, the interleaving is performed according to a second data unit, where the first data unit includes at least two bits, and the second data unit includes at least two bits, and for the third interleaving, the interleaving is performed according to a bit.

Optionally, when the FEC unit 110 sends the data stream s1100 and the data stream s1101, and the FEC unit 111 sends the data stream s1110 and the data stream s1111, the interleaving unit 12 may be further specifically configured to:

perform first interleaving on the data stream s1100 and the data stream s1110; and perform second interleaving on the data stream s1101 and the data stream s1111, where the output data stream includes a data stream that is obtained by performing the first interleaving and a data stream that is obtained by performing the second interleaving. In this manner, the interleaving is no longer performed on the data stream that is obtained by performing the first interleaving and the data stream that is obtained by performing the second interleaving.

Preferably, for the first interleaving, the interleaving is performed according to a first data unit, and for the second interleaving, the interleaving is performed according to a second data unit, where the first data unit includes at least two bits, and the second data unit includes at least two bits.

In the sending device 10, the FEC unit 11 and the interleaving unit 12 are implemented by hardware chips that are independent of each other, or by a same hardware chip. Multiple FEC units may belong to a same hardware chip, and each FEC unit is one hardware unit in the hardware chip. The sending unit 10 is also a unit that is implemented by hardware.

The sending device 10 may be the sending device in the embodiment corresponding to FIG. 1, the embodiment corresponding to FIG. 2, the embodiment corresponding to FIG. 5, or the embodiment corresponding to FIG. 7, and can implement all functions of the sending devices in the four embodiments. The sending device 10 may further be the sending device in the embodiment corresponding to FIG. 11, FIG. 12, FIG. 13, or FIG. 14, and can implement all functions of the sending devices in the foregoing embodiments.

The sending device in this embodiment performs interleaving on at least two data streams encoded by different FEC units, and sends data obtained through the interleaving to a receiving device. In this way, the receiving device can perform de-interleaving on a data stream after the interleaving, and send at least data streams obtained through the de-interleaving to different FEC units for decoding. When a bit error occurs during a transmission process of the data stream obtained through the interleaving, the data streams obtained after the de-interleaving are sent to the different FEC units for decoding. Therefore, for an FEC unit, the number of bit errors received by the FEC unit decreases. In other words, a probability that the FEC unit performs error correction successfully increases. On the whole, when success rates of error correction of one or more FEC units in the receiving device increase, an error correction capability of the receiving device is improved. In addition, in this embodiment, an interleaving manner of writing by row and reading by column is not needed; therefore, no delay is generated. In addition, an interleaver that implements the interleaving manner of writing by row and reading by column is complex in design and consumes much power. In this embodiment, such a special interleaver is not needed; therefore, the implementation is simple and power consumption of a device is reduced. To sum up, the sending device in this embodiment helps implement a simple, energy-saving, and efficient error correction method.

Figure 10:
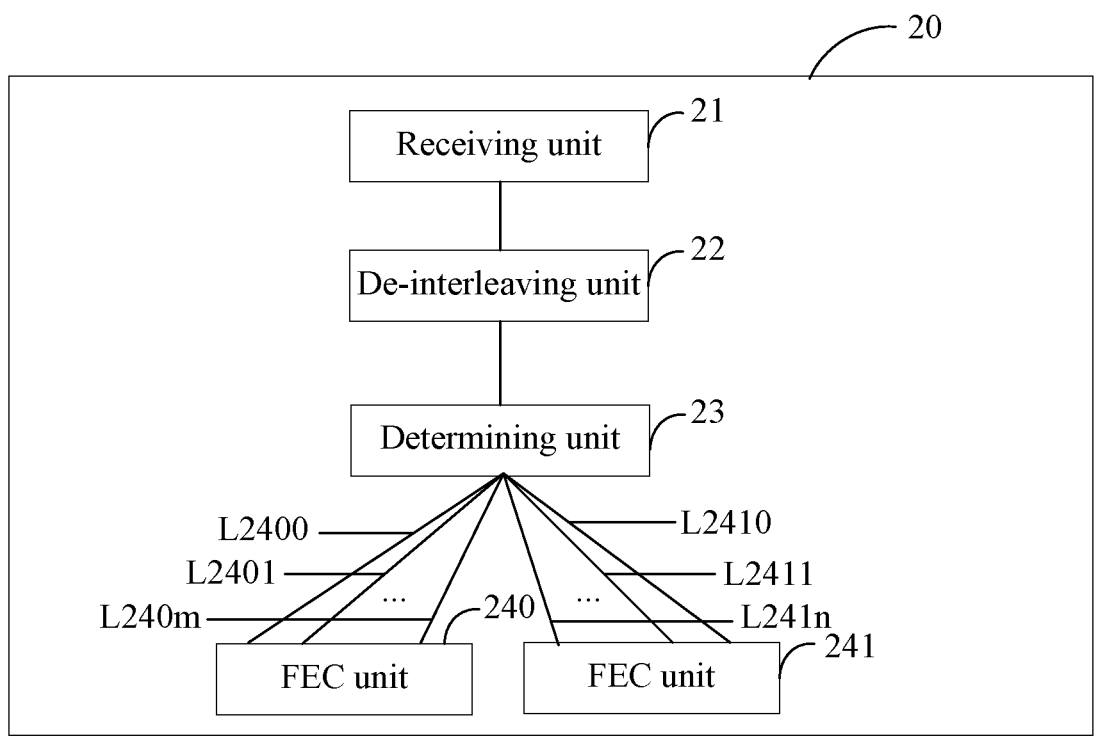
FIG. 10 is a schematic diagram of a receiving device according to an embodiment of the present invention.

As shown in FIG. 10, an embodiment of the present invention provides a receiving device 20, where the receiving device 20 includes a receiving unit 21, a de-interleaving unit 22, and a determining unit 23. The receiving device 20 further includes an FEC unit 240 and an FEC unit 241. In addition, the receiving device 20 may further include one or more other FEC units.

The receiving unit 21 is configured to receive a first data stream from a sending device. The first data stream may be one data stream or at least two data streams. For example, the first data stream in this embodiment may be the data stream i0 shown in FIG. 1, or the data streams i00 and i01 shown in FIG. 2.

The de-interleaving unit 22 is configured to perform de-interleaving on the first data stream, to obtain a second data stream and a third data stream.

The determining unit 23 is configured to perform the following operation:

determining that the second data stream includes a first channel identifier and the third data stream includes a second channel identifier, where the first channel identifier is a channel identifier of a first channel that is connected to an FEC unit a in the sending device, and the second channel identifier is a channel identifier of a second channel that is connected to an FEC unit b in the sending device.

When the first data stream is sent by the sending device 10 shown in FIG. 9, the first channel identifier may be a channel identifier of a channel L1100, the FEC unit a may be an FEC unit FEC110, the second channel identifier may be a channel identifier of a channel L1110, and the FEC unit b may be an FEC unit 111.

When the determining unit 23 can determine that one data stream includes one channel identifier, it indicates that this data stream includes this channel identifier, and this channel identifier exists in an identifiable manner. For example, in this embodiment, it indicates that the second data stream obtained through the de-interleaving already includes the first channel identifier, and the third data stream obtained through the de-interleaving already includes the second channel identifier. If the receiving device 20 receives a data stream a, the de-interleaving is performed on the data stream a to obtain a data stream b and a data stream c. However, if the determining unit 23 determines that at least one data stream of the data stream b and the data stream c does not include a channel identifier, the data stream a shall not be considered as the first data stream in this embodiment.

The determining unit 23 continues to perform the following operation:

determining, according to the first channel identifier and a first correspondence that is configured in the receiving device, a third channel identifier corresponding to the first channel identifier, where the first correspondence includes a correspondence between the first channel identifier and the third channel identifier, and the third channel identifier is a channel identifier of a third channel that is connected to one FEC unit in the receiving device 20, for example, the third channel may be a channel L2400, and the FEC unit connected to the third channel may be the FEC unit 240. The FEC unit connected to the third channel needs to have a capability of performing FEC decoding on the second data stream.

After determining the third channel identifier, the determining unit 23 sends, by using the third channel, the second data stream to the FEC unit in the receiving device 20 and connected to the third channel, for FEC decoding.

The receiving device 20 further determines, according to the second channel identifier and a second correspondence that is configured in the receiving device, a fourth channel identifier corresponding the second channel identifier, where the second correspondence includes a correspondence between the second channel identifier and the fourth channel identifier, the fourth channel identifier is a channel identifier of a fourth channel connected to another FEC unit in the receiving device, and the another FEC unit refers to one FEC unit that is different from the FEC unit in the receiving device 20 and connected to the third channel. For example, when the FEC unit connected to the third channel is the FEC unit 240, the another FEC unit may be the FEC unit 241 or another FEC unit in the receiving device 20 and not shown in FIG. 10. When the another FEC unit is the FEC unit 241, the fourth channel may be a channel L2410, a channel L2411, or another channel connected to the FEC unit 241. The FEC unit connected to the fourth channel should have a capability of performing FEC decoding on the third data stream.

The receiving device 20 further sends, by using the fourth channel, the third data stream to the FEC unit in the receiving device 20 and connected to the fourth channel, for FEC decoding.

When a bit error exists in the first data stream, a de-interleaving operation is performed; therefore, the bit error may be allocated to the second data stream and the third data stream. The second data stream and the third data stream are allocated to different FEC units for FEC decoding; therefore, a case in which error correction is performed by using only one FEC unit can be prevented to a great extent, and one or more other FEC units in the receiving device can be more fully utilized for the error correction, to improve an error correction capability of the receiving device.

In this embodiment, the sending device may perform the interleaving on data streams in multiple manners; therefore, there may be multiple manners of de-interleaving processing by the de-interleaving unit 22.

The de-interleaving unit 22 may perform the de-interleaving in the manner shown in FIG. 3, FIG. 4, FIG. 6, or FIG. 8.

When the de-interleaving unit 22 performs the de-interleaving in the manner shown in FIG. 3, the de-interleaving unit 22 performs the de-interleaving on the received data stream i0, to obtain a data stream a0 and a data stream a4. The data stream i0 may be considered as the first data stream received by the receiving device 20, the data stream a0 may be considered as the second data stream obtained by the de-interleaving unit 22, and the data stream a4 may be considered as the third data stream obtained by the de-interleaving unit 22.

When the de-interleaving unit 22 performs the de-interleaving in the manner shown in FIG. 4, the de-interleaving unit 22 performs the de-interleaving on the two data streams: the data stream i00 and the data stream i01 that are received, to obtain the data stream a0 and the data stream a4. The data stream i00 may be considered as the first data stream received by the receiving device 20, the data stream i01 may be considered as another data stream received by the receiving device 20, the data stream a0 may be considered as the second data stream obtained by the de-interleaving unit 22, and the data stream a4 may be considered as the third data stream obtained by the de-interleaving unit 22.

When the de-interleaving unit 22 performs the de-interleaving in the manner shown in FIG. 6, the de-interleaving unit 22 performs first de-interleaving on a received data stream i2, to obtain the data stream i0 and a data stream i1. Second de-interleaving is performed on the data stream i0, to obtain a data stream a00 and a data stream a40 from the data stream i0; and third de-interleaving is performed on the data stream i1, to obtain data streams a20 and a60 from the data stream i1. The data stream i2 may be considered as the first data stream, the data stream a00 may be considered as the second data stream, and the data stream a40 may be considered as the third data stream. The data stream i0 may be considered as a fourth data stream, the data stream i1 may be considered as a fifth data stream, the data stream a20 may be considered as a sixth data stream, and the data stream a60 may be considered as a seventh data stream.

When the de-interleaving unit 22 performs the de-interleaving in the manner shown in FIG. 8, the de-interleaving unit 22 performs first de-interleaving on a received data stream i2', to obtain a data stream i0' and a data stream i1', where for the first de-interleaving, the de-interleaving is performed according to a bit. Second de-interleaving is performed on a data stream i0', to obtain a data stream a00 and a data stream a40 from the data stream i0'; and third de-interleaving is performed on the data stream i1', to obtain data streams a20 and a60 from the data stream i1'. Preferably, for the second de-interleaving, the de-interleaving is performed according to a first data unit, and for the third de-interleaving, the de-interleaving is performed according to a second data unit, where the first data unit includes at least two bits, and the second data unit includes at least two bits. The data stream i2' may be considered as the first data stream, the data stream a00 may be considered as the second data stream, and the data stream a40 may be considered as the third data stream. The data stream i0' may be considered as a fourth data stream, the data stream i1' may be considered as a fifth data stream, a data stream a80 may be considered as a sixth data stream, and a data stream a120 may be considered as a seventh data stream.

When the de-interleaving unit 22 performs the de-interleaving in the manner shown in FIG. 3 or FIG. 4, operations performed by the determining unit 23 includes the foregoing operations performed by the determining unit 23 on the second data stream and the third data stream in this embodiment.

When the de-interleaving unit 22 performs the de-interleaving in the manner shown in FIG. 6 or FIG. 8, data streams obtained through the de-interleaving not only include the second data stream and the third data stream, but also include the sixth data stream and the seventh data stream.

Therefore, preferably, the determining unit 23 further needs to process the sixth data stream and the seventh data stream, and a processing manner is the same as a processing manner of the second data stream and the third data stream that belong to a same embodiment as the sixth data stream and the seventh data stream.

Specifically, when the de-interleaving unit performs the de-interleaving in the manner shown in FIG. 6, the determining unit 23 determines that the sixth data stream includes a fifth channel identifier and the seventh data stream includes a sixth channel identifier. The fifth channel identifier is a channel identifier of a fifth channel in the sending device and connected to the FEC unit a, and the sixth channel identifier is a channel identifier of a sixth channel in the sending device and connected to the FEC unit b. For example, the FEC unit a may be the FEC unit 110 shown in FIG. 7, the FEC unit b may be the FEC unit 111 shown in FIG. 7, the fifth channel may be the channel L1101 shown in FIG. 7, and the sixth channel may be the channel L1111 shown in FIG. 7.

The determining unit 23 determines, according to the fifth channel identifier and a third correspondence that is configured in the receiving device, a seventh channel identifier corresponding to the fifth channel identifier. The third correspondence includes a correspondence between the fifth channel identifier and the seventh channel identifier, the seventh channel identifier is a channel identifier of a seventh channel, and the seventh channel and the third channel are connected to a same FEC unit in the receiving device. For example, the seventh channel may be the channel L2401 in FIG. 8, the third channel is the L2400, and the channel L2401 and the channel L2400 are both connected to the FEC unit 240. The determining unit 23 is further configured to send, by using the seventh channel, the sixth data stream to the FEC unit connected to the seventh channel, for FEC decoding. The FEC unit connected to the seventh channel needs to have a capability of performing FEC decoding on the sixth data stream.

The determining unit 23 determines, according to the sixth channel identifier and a fourth correspondence that is configured in the receiving device, an eighth channel identifier corresponding to the sixth channel identifier. The fourth correspondence includes a correspondence between the sixth channel identifier and the eighth channel identifier, the eighth channel identifier is an identifier of an eighth channel, and the eighth channel and the fourth channel are connected to a same FEC unit in the receiving device. For example, the eighth channel may be the channel L241*n* in FIG. 8, the fourth channel is the channel L2410, and the channel L241*n* and the channel L2410 are both connected to the FEC unit 241. The determining unit 23 is further configured to send, by using the eighth channel, the seventh data stream to the FEC unit connected to the eighth channel, for FEC decoding. The FEC unit connected to the eighth channel needs to have a capability of performing FEC decoding on the seventh data stream.

When the de-interleaving unit performs the de-interleaving in the manner shown in FIG. 8, an operation performed by the determining unit 23 is similar to that performed by the determining unit 23 when the de-interleaving unit performs the de-interleaving in the manner shown in FIG. 6. Details are not described herein again.

In this embodiment, the determining unit 23 may be one hardware chip or may include multiple hardware chips that are independent of each other. The de-interleaving unit 22 may be independent of the determining unit 23, or integrated with the determining unit 23 or a part of the determining unit 23. The receiving device 20 may be the receiving device in the embodiment corresponding to FIG. 3, FIG. 4, or FIG. 6, and can perform all operations performed by the receiving device in the embodiment corresponding to FIG. 3, FIG. 4, or FIG. 6.

In this embodiment, data units in which an error occurs are sent to different FEC units. Therefore, for an FEC unit, the number of bit errors received by the FEC unit decreases. In other words, a probability that the FEC unit performs error correction successfully increases. On the whole, when success rates of error correction of one or more FEC units in the receiving device increase, an error correction capability of the receiving device is improved. In addition, in this embodiment, an interleaving manner of writing by row and reading by column is not needed; therefore, no delay is generated. In addition, an interleaver that implements the interleaving manner of writing by row and reading by column is complex in design and consumes much power. In this embodiment, such a special interleaver is not needed; therefore, the implementation is simple and power consumption of a device is reduced.

A person of ordinary skill in the art may understand that all or a part of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

The foregoing descriptions are merely exemplary specific implementation manners of the present invention, but are not intended to limit the protection scope of the present invention. Any variation or replacement readily figured out by a person skilled in the art within the technical scope disclosed in the present invention shall fall within the protection scope of the present invention.

What is claimed is:

1. A method for generating data streams, comprising:
generating first Forward Error Code (FEC) encoded data by a first FEC encoder;
generating second FEC encoded data by a second FEC encoder;
generating a plurality of data streams by performing first interleaving on the first FEC encoded data and the second FEC encoded data, wherein:
a number of the plurality of data streams is 2N and N is a natural number greater than 1,
two adjacent data units in any one of the plurality of data streams are from the first FEC encoded data and from the second FEC encoded data, respectively, and
the first interleaving is performed according to a data unit comprising at least two bits; and
obtaining at least one interleaved data stream by performing second interleaving on the plurality of data streams, wherein the second interleaving is performed according to a data unit comprising only one bit.

2. The method of claim 1, wherein N is 2, 4 or 8.

3. The method of claim 1, wherein the plurality of data streams comprises a first data stream, and the first data stream comprises a first data unit of the first FEC encoded data and a second data unit of the first FEC encoded data, an order of the first data unit and the second data unit in the first data stream is the same as an order of the first data unit and the second data unit in the first FEC encoded data.

4. The method of claim 1, further comprising:
transmitting the at least one interleaved data stream.

5. The method of claim 1, wherein adjacent bits in any interleaved data stream of the at least one interleaved data stream come from different data streams of the plurality of data streams.

6. The method of claim 1, wherein the method is performed by a device of a high-speed Ethernet.

7. The method of claim 6, wherein the high-speed Ethernet includes 100GE, 400GE, or 1TE.

8. A device, comprising:
a first Forward Error Code (FEC) encoder, configured to generate first FEC encoded data;
a second FEC encoder, configured to generate second FEC encoded data;
an interleaver, configured to generate a plurality of data streams by performing first interleaving on the first FEC encoded data and the second FEC encoded data, wherein a number of the plurality of data streams is 2N and N is a natural number greater than 1, and two adjacent data units in any one of the plurality of data streams are from the first FEC encoded data and from the second FEC encoded data, respectively, wherein the first interleaving is performed according to a data unit comprising at least two bits; and
the interleaver is further configured to obtain at least one interleaved data stream by performing second interleaving on the plurality of data streams, wherein the second interleaving is performed according to a data unit comprising only one bit.

9. The device of claim 8, wherein N is 2, 4 or 8.

10. The device of claim 8, wherein the plurality of data streams comprises a first data stream, the first data stream comprises a first data unit of the first FEC encoded data and a second data unit of the first FEC encoded data, and an order of the first data unit and the second data unit in the first data stream is the same as an order of the first data unit and the second data unit in the first FEC encoded data.

11. The device of claim 8, further comprising:
a transmitter, configured to transmit the at least one interleaved data stream.

12. The device of claim 8, wherein adjacent bits in any data stream of the at least one interleaved data stream come from different data streams of the plurality of data streams.

13. The device of claim 8, wherein the device is one or more chips, or the device is a network device.

14. The device of claim 8, wherein the device is a device of a high-speed Ethernet.

15. The device of claim 14, wherein the high-speed Ethernet includes 100GE, 400GE, or 1TE.

16. A device, comprising:
a receiver, configured to receive at least one interleaved data stream;
a de-interleaver, configured to obtain a plurality of data streams by performing first de-interleaving on the at least one interleaved data stream received by the receiver, wherein the first de-interleaving is performed according to a data unit comprising only one bit, and a number of the plurality of data streams is 2N and N is a natural number greater than 1; and
the de-interleaver is further configured to obtain first Forward Error Code (FEC) encoded data and second FEC encoded data by performing second de-interleaving on the plurality of data streams, wherein the second de-interleaving is performed according to a data unit comprising at least two bits.

17. The device of claim 16, wherein N is 2, 4 or 8.

18. The device of claim 16, further comprising:
- a first FEC decoder, configured to decode the first FEC encoded data; and
- a second FEC decoder, configured to decode the second FEC encoded data.

19. The device of claim 18, wherein the plurality of data streams comprises a first data stream and a second data stream, and the first data stream comprises a first data unit and a second data unit, the second data stream comprises a third data unit and a fourth data unit, and the de-interleaver is configured to:
- obtain the first data unit of the first FEC encoded data, the third data unit of the first FEC encoded data, the second data unit of the second FEC encoded data and the fourth data unit of the second FEC encoded data by performing the second de-interleaving on the first data stream and the second data stream.

20. The device of claim 19, wherein
- the first FEC decoder is specifically configured to decode the first data unit and the third data unit; and
- the second FEC decoder is specifically configured to decode the second data unit and the fourth data unit.

21. The device of claim 18, wherein the plurality of data streams comprises a third data stream and a fourth data stream, and the third data stream comprises a fifth data unit and a sixth data unit, the fourth data stream comprises a seventh data unit and a eighth data unit, and the de-interleaver is configured to:
- obtaining the fifth data unit of the first FEC encoded data, the seventh data unit of the first FEC encoded data, the sixth data unit of the second FEC encoded data and the eighth data unit of the second FEC encoded data by performing the second de-interleaving on the third data stream and the fourth data stream.

22. The device of claim 21, wherein
- the first FEC decoder is specifically configured to decode the fifth data unit and the seventh data unit; and
- the second FEC decoder is specifically configured to decode the sixth data unit and the eighth data unit.

23. The device of claim 16, wherein the device is one or more chips, or the device is a network device.

24. The device of claim 16, wherein the device is a device of a high-speed Ethernet.

25. The device of claim 24, wherein the high-speed Ethernet includes 100GE, 400GE, or 1TE.

26. The device of claim 16, wherein two adjacent data units in any one of the plurality of data streams are de-interleaved to the first FEC encoded data and to the second FEC encoded data, respectively.

27. A system, comprising: a sending device and a receiving device, wherein the sending device comprises a first Forward Error Code (FEC) encoder, a second FEC encoder and an interleaver, and the receiving device comprises a receiver and a de-interleaver, and wherein
- the first Forward Error Code (FEC) encoder is configured to generate first FEC encoded data;
- the second FEC encoder is configured to generate second FEC encoded data;
- the interleaver is configured to generate a plurality of data streams by performing first interleaving on the first FEC encoded data and the second FEC encoded data, wherein a number of the plurality of data streams is 2N and N is a natural number greater than 1, and two adjacent data units in any one of the plurality of data streams are from the first FEC encoded data and from the second FEC encoded data, respectively, wherein the first interleaving is performed according to a data unit comprising at least two bits;
- the interleaver is further configured to obtain at least one interleaved data stream by performing second interleaving on the plurality of data streams, wherein the second interleaving is performed according to a data unit comprising only one bit;
- the receiver is configured to receiving at least one interleaved data stream from the sending device;
- the de-interleaver is configured to obtain the plurality of data streams by performing first de-interleaving on the at least one interleaved data stream received by the receiver, wherein the first de-interleaving is performed according to a data unit comprising only one bit;
- the de-interleaver is further configured to obtain the first FEC encoded data and the second FEC encoded data by performing second de-interleaving on the plurality of data streams, wherein the second de-interleaving is performed according to a data unit comprising at least two bits.

28. The system of claim 27, wherein N is 2, 4 or 8.

29. The system of claim 27, wherein the sending device comprises one or more chips, or the sending device is a network device.

30. The system of claim 27, wherein the sending device is a device of a high-speed Ethernet, and wherein the high-speed Ethernet includes 100GE, 400GE, or 1TE.

* * * * *